(12) United States Patent
Iwamoto

(10) Patent No.: US 11,139,266 B2
(45) Date of Patent: Oct. 5, 2021

(54) MANUFACTURING METHOD FOR ELECTRONIC COMPONENT, AND ELECTRONIC COMPONENT

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 270 days.

(21) Appl. No.: 16/788,331

(22) Filed: Feb. 12, 2020

(65) Prior Publication Data

US 2020/0185354 A1 Jun. 11, 2020

Related U.S. Application Data

(63) Continuation of application No. PCT/JP2018/030182, filed on Aug. 13, 2018.

(30) Foreign Application Priority Data

Aug. 21, 2017 (JP) .............................. JP2017-158854

(51) Int. Cl.
| | | |
|---|---|---|
| *H01L 23/00* | (2006.01) | |
| *H01L 21/56* | (2006.01) | |
| *H01L 21/768* | (2006.01) | |
| *H01L 23/66* | (2006.01) | |
| *H01L 25/00* | (2006.01) | |

(52) U.S. Cl.
CPC ............ *H01L 24/85* (2013.01); *H01L 21/565* (2013.01); *H01L 21/76879* (2013.01); *H01L 23/66* (2013.01); *H01L 24/43* (2013.01); *H01L 24/45* (2013.01); *H01L 25/50* (2013.01); *H01L 2223/6611* (2013.01)

(58) Field of Classification Search
CPC . H01L 24/85; H01L 21/565; H01L 21/76879; H01L 24/43
See application file for complete search history.

(56) References Cited

U.S. PATENT DOCUMENTS

| | | |
|---|---|---|
| 2009/0057849 A1 | 3/2009 | Tang et al. |
| 2017/0047281 A1* | 2/2017 | Hu ..................... H01L 21/4846 |
| 2018/0151389 A1 | 5/2018 | Kuo et al. |

FOREIGN PATENT DOCUMENTS

| | | |
|---|---|---|
| JP | 2001-291799 A | 10/2001 |
| JP | 2002-016327 A | 1/2002 |
| JP | 2010-538463 A | 12/2010 |
| WO | 2014/178153 A1 | 11/2014 |

OTHER PUBLICATIONS

Official Communication issued in International Patent Application No. PCT/JP2018/030182 dated Nov. 6, 2018.

* cited by examiner

*Primary Examiner* — Errol V Fernandes
(74) *Attorney, Agent, or Firm* — Keating & Bennett, LLP

(57) ABSTRACT

A manufacturing method for an electronic component includes forming an electrically conductive pillar on a surface of a support, forming an intermediate layer covering a side surface of the pillar, forming a conductor layer covering a side surface of the intermediate layer, and molding a resin structure covering a side surface of the conductor layer.

16 Claims, 12 Drawing Sheets

FIG. 4A
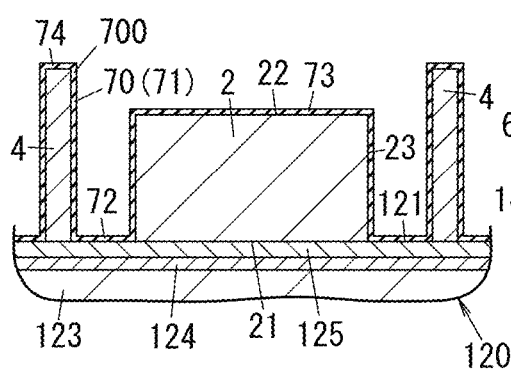
FIG. 4D
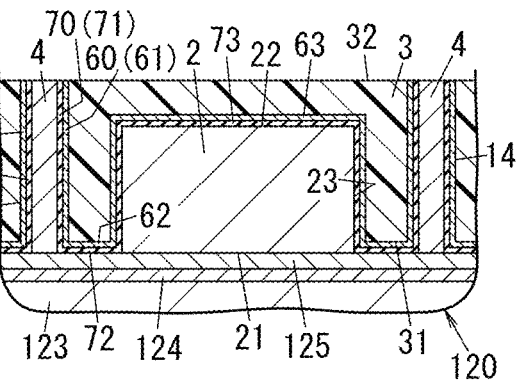
FIG. 4B
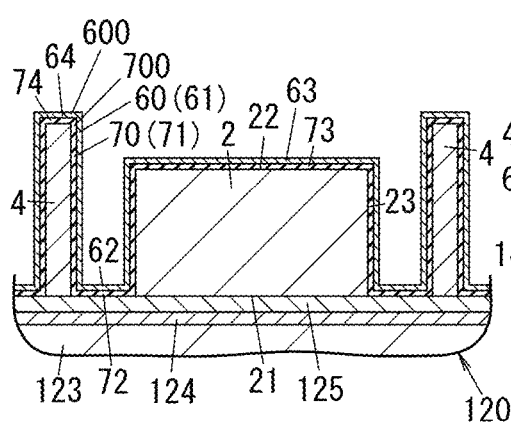
FIG. 4E
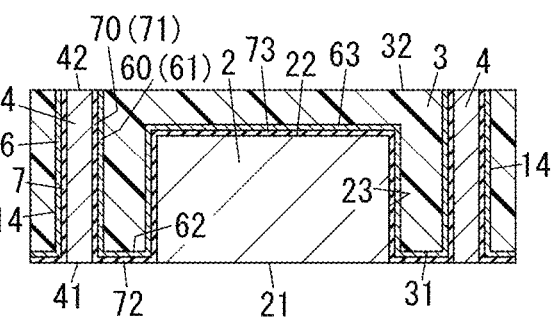
FIG. 4C
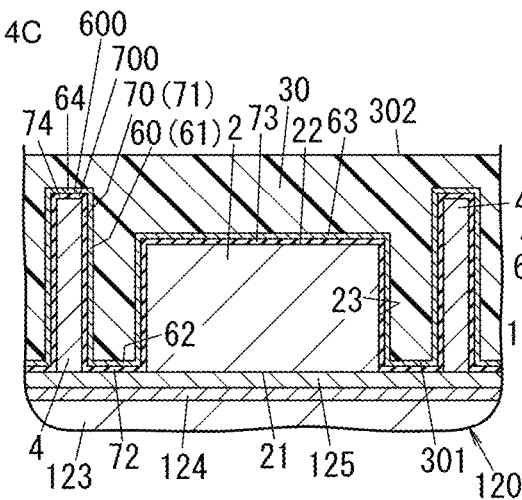
FIG. 4F

MANUFACTURING METHOD FOR ELECTRONIC COMPONENT, AND ELECTRONIC COMPONENT

CROSS REFERENCE TO RELATED APPLICATIONS

This application claims the benefit of priority to Japanese Patent Application No. 2017-158854 filed on Aug. 21, 2017 and is a Continuation Application of PCT Application No. PCT/JP2018/030182 filed on Aug. 13, 2018. The entire contents of each application are hereby incorporated herein by reference.

BACKGROUND OF THE INVENTION

1. Field of the Invention

The present invention generally relates to a manufacturing method for an electronic component, and an electronic component and, more a particularly, to a manufacturing method for an electronic component having a coaxial structure, and an electronic component.

2. Description of the Related Art

Hitherto, a circuit board including signal via conductors (conductor pillars) and grounding via conductors (conductor layers) is known as an electronic component (see, for example, Japanese Unexamined Patent Application Publication No. 2001-291799).

In the circuit board described in Japanese Unexamined Patent Application Publication No. 2001-291799, the grounding via conductors each are disposed around the associated signal via conductor coaxially so as to be substantially coincident with an axis of the signal via conductor. Also, in the circuit board, a filler is formed between each signal via conductor and an associated one of the grounding via conductors. The filler is made of glass ceramics. The circuit board also includes embedded capacitors.

When the internal structure of the circuit board described in Japanese Unexamined Patent Application Publication No. 2001-291799 is roughly segmented into a fan-out portion including a first electrically insulating layer to a fifth electrically insulating layer and an embedded capacitor including a sixth electrically insulating layer to a tenth electrically insulating layer. The material of the first electrically insulating layer to fifth electrically insulating layer is ceramics or glass ceramics. The sixth electrically insulating layer to the tenth electrically insulating layer are made from a high dielectric layer including $BaTiO_3$ as a main ingredient.

The circuit board is formed by a manufacturing method for a multilayer substrate. In other words, through-holes are formed at predetermined positions of raw sheets that will be the electrically insulating layers after being fired, metallized ink is printed in the through-holes and the surfaces of the raw sheets, the electrically insulating layers are laminated and pressure-bonded, then fired, and further applied with desired plating, or the like. Thus, the circuit board is finished. The fillers are formed as follows. Glass ceramics having a low dielectric constant is filled in the through-holes formed in advance, dried, through-holes for forming signal via conductors are formed at their centers, and then metallized ink is filled in the through-holes.

With the existing manufacturing method for an electronic component, described in Japanese Unexamined Patent Application Publication No. 2001-291799, as the aperture area of a through-hole reduces and the aspect ratio of the through-hole increases, formation of a through-hole becomes more difficult, and formation of a filler becomes more difficult. In addition, with the existing manufacturing method for an electronic component, as the aspect ratio of a signal via conductor increases, formation of a coaxial structure including a signal via conductor and a grounding via conductor becomes more difficult.

SUMMARY OF THE INVENTION

Preferred embodiments of the present invention provide manufacturing methods for electronic components, and electronic components, which each facilitate manufacturing of an electronic component with a coaxial structure.

A manufacturing method for an electronic component according to a preferred embodiment of the present invention includes forming an electrically conductive pillar on a surface of a support, forming an intermediate layer covering a side surface of the pillar, forming a conductor layer covering a side surface of the intermediate layer, and molding a resin structure covering a side surface of the conductor layer.

An electronic component according to a preferred embodiment of the present invention includes an electrically conductive pillar, a conductor layer, an intermediate layer, and a resin molding. The conductor layer surrounds a side surface of the pillar. The conductor layer is spaced away from the side surface of the pillar. The intermediate layer includes an electrically insulating layer. The intermediate layer is interposed between the pillar and the conductor layer. The resin molding covers a side surface of the conductor layer.

With the manufacturing methods for electronic components, and the electronic components, according to preferred embodiments of the present invention, electronic components with a coaxial structure are able to be easily manufactured.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A to 4F are process cross-sectional views for illustrating a manufacturing method for the above-described electronic component.

DETAILED DESCRIPTION OF THE PREFERRED EMBODIMENTS

Figure 1A:
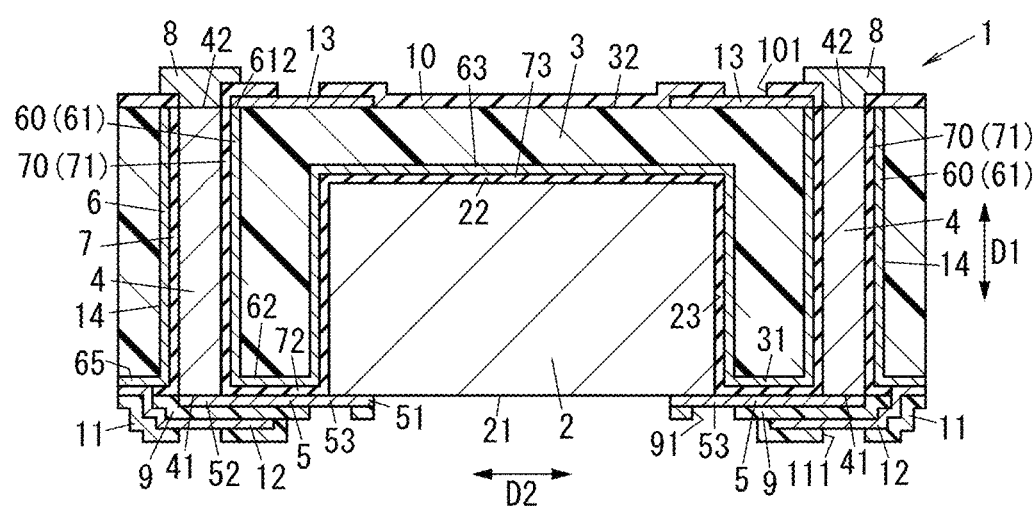
FIG. 1A is a cross-sectional view of an electronic component according to a first preferred embodiment of the present invention.

Hereinafter, electronic components according to preferred embodiments of the present invention will be described in detail with reference to the drawings.

FIGS. 1A and 1B, FIG. 2, FIGS. 3A to 3C, FIGS. 4A to 4F, FIGS. 5A to 5D, FIG. 6 to FIG. 12, FIGS. 13A to 13F, and FIGS. 14A to 14F that will be referred to in the following preferred embodiments, and the like, all are schematic diagrams, and the ratios of the sizes and thicknesses of elements in the drawings do not always reflect actual scale ratios.

First Preferred Embodiment (1) General Configuration of Electronic Component Hereinafter, an electronic component 1 according to a first preferred embodiment of the present invention will be described with reference to the drawings.

As shown in FIG. 1A, the electronic component 1 according to the first preferred embodiment includes a chip electronic component 2, a resin molding 3, a plurality of (two in the illustrated example) pillars 4 having electrical conductivity (hereinafter, also referred to as conductor pillars 4), a plurality of (two in the illustrated example) wiring layers 5, an electrically conductive shield portion 6, and an electrically insulating portion 7 having an electrically insulating property. In the electronic component 1, the resin molding 3 holds the chip electronic component 2 and the conductor pillars 4. In the electronic component 1, the resin molding 3 protects the chip electronic component 2 against impact, or the like, from the outside. The conductor pillars 4 are located to the sides of the chip electronic component 2 and extend through the resin molding 3 in a thickness direction (predetermined direction) of the resin molding 3. The wiring layers 5 each electrically connect the chip electronic component 2 and an associated one of the conductor pillars 4.

The electronic component 1 further includes first resist layers 9, a second resist layer 10, third resist layers 11, first grounding wiring layers 12, and second grounding wiring layers 13. The electronic component 1 includes a plurality of (two in the illustrated example) electrodes 8 and a plurality of (two in the illustrated example) electrodes 53 that provide external connection. The plurality of electrodes 8 are disposed on a second surface 32 side opposite from a first surface 31 of the resin molding 3. In the electronic component 1, a portion of each of the plurality of wiring layers 5 also defines and functions as the electrode 53. The plurality of wiring layers 5 is disposed on the first surface 31 side of the resin molding 3. The first resist layers 9 each are provided on an associated one of the wiring layers 5. The first grounding wiring layers 12 are electrically connected to the shield portion 6. The first grounding wiring layers 12 each are provided on an associated one of the first resist layers 9. The second resist layer 10 is provided on the second grounding wiring layers 13. The second grounding wiring layers 13 are electrically connected to the shield portion 6. The second grounding wiring layers 13 are also provided on the second surface 32 of the resin molding 3. The third resist layers 11 each are provided on an associated one of the first grounding wiring layers 12.

Figure 1B:
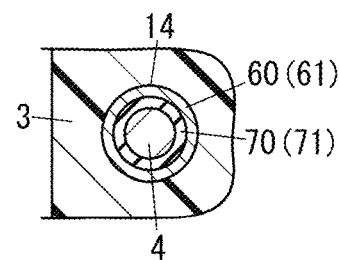
FIG. 1B is an enlarged view of a relevant portion including a coaxial structure in a cross section perpendicular to a thickness direction of the above-described electronic component.

The electronic component 1 according to the first preferred embodiment has coaxial structures 14 each including the conductor pillar 4 and a conductor layer 60 surrounding the conductor pillar 4 (see FIGS. 1A and 1B). In the electronic component 1, the conductor layer 60 is a portion of the shield portion 6. The coaxial structure 14 includes an intermediate layer 70 interposed between a side surface of the conductor pillar 4 and the conductor layer 60. In the electronic component 1, the intermediate layer 70 is an electrically insulating layer and is a portion of the electrically insulating portion 7.

Figure 2:
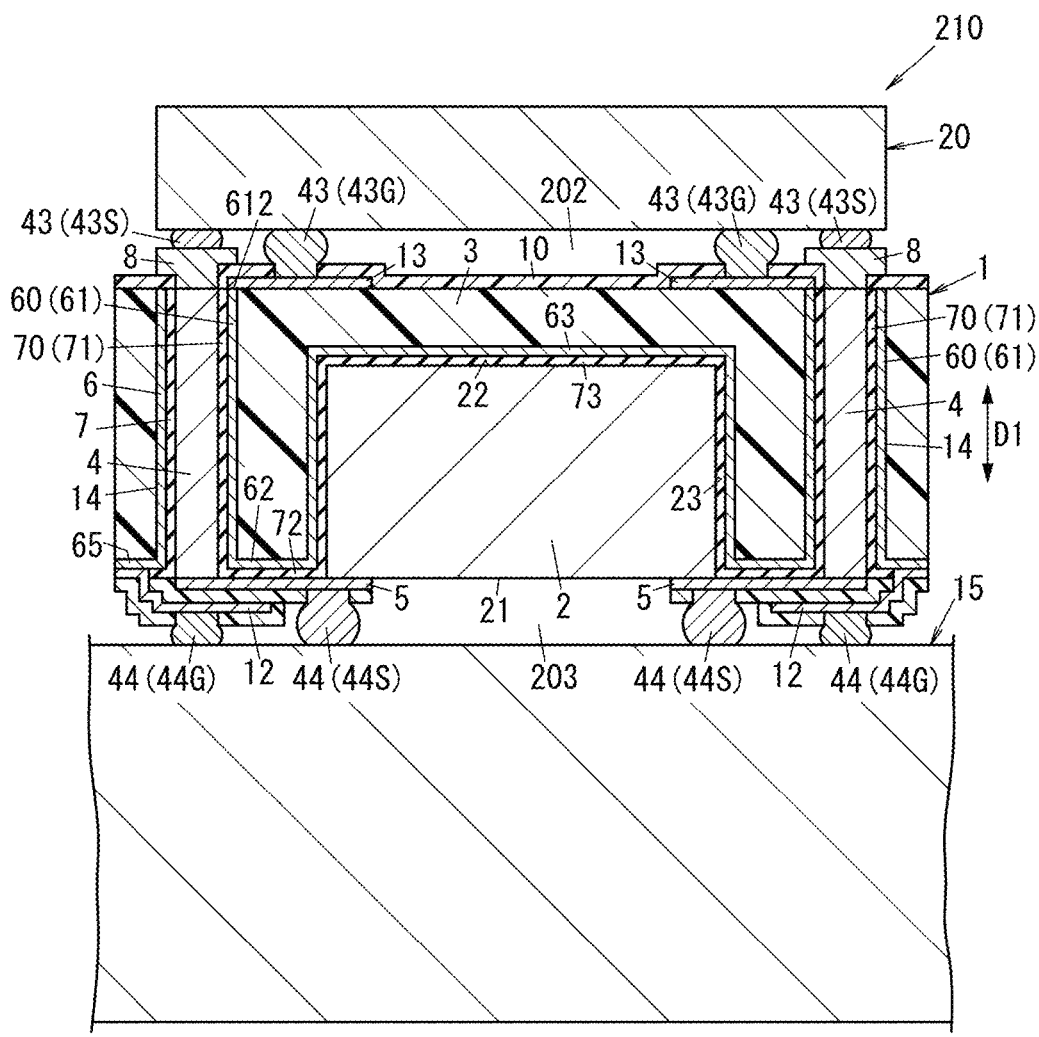
FIG. 2 is a cross-sectional view of an electronic component module in a case where the above-described electronic component is used as an interposer.

The electronic component 1 may preferably be, for example, used as an interposer to be interposed between another electronic component 20 (see FIG. 2) and a circuit board 15 (see FIG. 2). The circuit board 15 is preferably, for example, a printed circuit board.

(2) Elements of Electronic Component

Next, the elements of the electronic component 1 will be described with reference to the drawings.

(2.1) Chip Electronic Component

As shown in FIG. 1A, the chip electronic component 2 includes a front surface (first main surface) 21 and a back surface (second main surface) 22 that are on opposite sides in a first direction D1 of the electronic component 1. More specifically, the chip electronic component 2 has a planar shape and includes the front surface 21 and the back surface 22 that are on opposite sides in the thickness direction. The front surface 21 and the back surface 22 are provided opposed to each other. The chip electronic component 2 also includes a side surface (outer periphery) 23. The plan-view shape of the chip electronic component 2 (the outer peripheral shape of the chip electronic component 2 when viewed in the thickness direction) is preferably a rectangular shape or a substantially rectangular shape. However, the shape is not limited to a rectangular or substantially rectangular shape and may be, for example, a square shape or a substantially square shape.

The chip electronic component 2 is preferably, for example, a radio-frequency device having a frequency band of about 5 GHz or higher. A radio-frequency device having a frequency band of about 5 GHz or higher is, for example, a near-field communication device or millimeter-wave device having a frequency band of about 5 GHz or higher.

More specifically, the radio-frequency device is preferably, for example, an SAW (surface acoustic wave) filter.

When the chip electronic component 2 is an SAW filter, the chip electronic component 2, for example, includes a piezoelectric substrate including a front surface (first main surface) and a back surface (second main surface) that are on opposite sides in the thickness direction, and a functional portion provided on the front surface of the piezoelectric substrate. The piezoelectric substrate is preferably, for example, an LiTaO$_3$ substrate or an LiNbO$_3$ substrate. The thickness of the piezoelectric substrate is preferably, for example, about 200 μm. The functional portion includes, for example, one or plurality of IDT (interdigital transducer) electrodes. The functional portion may include a terminal electrode(s) that provides external connection. The number of the terminal electrodes may be one or more. When the chip electronic component 2 is an SAW filter, the front surface 21 of the chip electronic component 2 includes, for example, an exposed portion of the front surface of the piezoelectric substrate and an exposed surface in the functional portion.

When the chip electronic component 2 is an SAW filter, the chip electronic component 2 is not limited to a configuration including a bulk piezoelectric substrate and may have, for example, a multilayer structure in which a silicon substrate, a silicon oxide film, and a piezoelectric thin film are laminated in this order and a configuration in which the functional portion (an interdigital transducer electrode, a terminal electrode, and the like) is provided on the piezoelectric thin film. The piezoelectric thin film is preferably, for example, an LiTaO$_3$ thin film or an LiNbO$_3$ thin film. The thickness of the piezoelectric thin film is preferably less than or equal to about 3.5λ, for example, where the wave length of acoustic waves, which is determined by the electrode finger pitch of the interdigital transducer electrode, is λ. The thickness of the piezoelectric thin film is preferably, for example, about 0.5 μm. The thickness of the silicon oxide film is preferably less than or equal to about 2.0λ, for example. The thickness of the silicon oxide film is preferably, for example, about 0.5 μm. The thickness of the multilayer structure is preferably, for example, about 200 μm.

The radio-frequency device is not limited to an SAW filter and may be, for example, a BAW (bulk acoustic wave) filter, a dielectric filter, an antenna, a switch, a power amplifier, or the like. The above-described other electronic component 20 is preferably, for example, an IC (integrated circuit). The electronic component 20 is not limited to an IC and may be, for example, an inductor, a capacitor, or an SAW filter. In an electronic component module 210 (see FIG. 2) including the electronic component 1, a gap 202 (see FIG. 2) is provided between the electronic component 1 and the above-described other electronic component 20. In the electronic component module 210, a gap 203 is also provided between the electronic component 1 and the circuit board 15. Also, in the electronic component module 210, the electronic component 1 is electrically connected to the electronic component 20 by a plurality of (four in the illustrated example) electrically conductive bumps 43, and is electrically connected to the circuit board 15 by a plurality of (four in the illustrated example) electrically conductive bumps 44.

(2.2) Resin Molding

As shown in FIG. 1A, the resin molding 3 is configured to hold the chip electronic component 2. The resin molding 3 includes the first surface 31 and the second surface 32 that are on opposite sides in the first direction D1 of the electronic component 1. More specifically, the resin molding 3 has a planar shape and includes the first surface 31 and the second surface 32 that are on opposite sides in the thickness direction. The plan-view shape of the resin molding 3 (the outer peripheral shape of the resin molding 3 when viewed in the thickness direction, that is, the first direction D1) is preferably a rectangular shape or a substantially rectangular shape. However, the plan-view shape of the resin molding 3 is not limited to a rectangular or substantially rectangular shape and may be, for example, a square shape or a substantially square. The size of the resin molding 3 in plan is greater than the size of the chip electronic component 2 in plan.

The resin molding 3 covers the back surface 22 and a portion of the side surface 23 of the chip electronic component 2 via the shield portion 6 and the electrically insulating portion 7. In other words, the chip electronic component 2 is disposed inside the resin molding 3. The resin molding 3 holds the chip electronic component 2 in a state where the front surface 21 of the chip electronic component 2 is exposed.

The resin molding 3 is made from a resin having an electrically insulating property, or the like. The resin molding 3, for example, preferably includes a filler mixed with resin in addition to the resin. However, the filler is not necessary. The resin is preferably, for example, epoxy resin. However, the resin is not limited to epoxy resin and may be, for example, polyimide resin, acrylic resin, urethane resin, or silicone resin. The filler is preferably, for example, an inorganic filler, such as silica and alumina. The resin molding 3 may include, for example, black pigment, such as carbon black, in addition to the resin and the filler.

(2.3) Conductor Pillar

As shown in FIG. 1A, in the electronic component 1, the plurality of (two in the illustrated example) conductor pillars 4 are disposed to the sides of the chip electronic component 2. In a second direction D2 perpendicular or substantially perpendicular to the first direction D1, the plurality of conductor pillars 4 are spaced away from the chip electronic component 2. The plurality of conductor pillars 4 is held by the resin molding 3.

Each conductor pillar 4 has a columnar shape and includes a first end surface 41 and a second end surface 42 that are on opposite sides in a direction parallel or substantially parallel to the thickness direction of the resin molding 3. In short, each conductor pillar 4 includes the first end surface 41 and the second end surface 42 that are on opposite sides in the first direction D1. A second end 52 of the wiring layer 5 (described later) is laminated on the first end surface 41 of the conductor pillar 4. Thus, in the electronic component 1, each conductor pillar 4 and an associated one of the wiring layers 5 are electrically connected.

In the electronic component 1, the conductor pillars 4 are electrically connected to the chip electronic component 2 via the associated wiring layers 5. In the electronic component 1, the position and number of the conductor pillars 4 are not limited.

The material of the conductor pillars 4 is, for example, a metal. In the electronic component 1 according to the first preferred embodiment, the material of the conductor pillars 4 is preferably, for example, Cu. The material of the conductor pillars 4 is not limited to Cu and may be, for example, Ni. The material of the conductor pillars 4 may also be an alloy.

(2.4) Wiring Layer

Each wiring layer 5 electrically connects the chip electronic component 2 and an associated one of the conductor pillars 4 on the first surface 31 side of the resin molding 3 and on the front surface 21 side of the chip electronic component 2. The wiring layer 5 includes the first end 51 connected to (the surface of the terminal electrode of) the front surface 21 of the chip electronic component 2 and the second end 52 connected to the conductor pillar 4. The wiring layer 5 is disposed over the front surface 21 of the chip electronic component 2, the first end surface 41 of the conductor pillar 4, and a second intermediate layer 72 of the electrically insulating portion 7 (described later).

The material of the wiring layers 5 is, for example, a metal. In the electronic component 1 according to the first preferred embodiment, the material of the wiring layers 5 is preferably Cu as one example. In short, the wiring layers 5 are Cu layers. The material of the wiring layers 5 may be, for example, an alloy. Each wiring layer 5 is not limited to a monolayer structure and may have a multilayer structure including a plurality of layers that are laminated.

(2.5) Electrode

Each electrode 8 is provided over the second end surface 42 of the conductor pillar 4 and the second resist layer 10 on the second surface 32 side of the resin molding 3.

The material of the electrodes 8 is, for example, a metal. In the electronic component 1 according to the first preferred embodiment, the material of the electrodes 8, as well as the wiring layers 5, is preferably Cu, for example. As in the case of the wiring layers 5, each electrode 8 is not limited to a monolayer structure and may have a multilayer structure including a plurality of layers that are laminated.

In the electronic component 1, a portion of the wiring layer 5 (a portion of the wiring layer 5, not covered with the first resist layer 9) is an electrode 53 that provides external connection to electrically connect the conductor pillar 4 to the circuit board 15 (see FIG. 2), or the like. In the electronic component 1, an electrode may be provided on the wiring layer 5. The electrode that is provided on the wiring layer 5 is preferably, for example, a multilayer film of a Ti film on the wiring layer 5 and an Au film on the Ti film. The multilayer structure of the electrode is only illustrative and is not limited to this example.

(2.6) First Resist Layer, Second Resist Layer, and Third Resist Layer

The first resist layers 9 are each provided on the first surface 31 side of the resin molding 3 so as to cover an associated one of the wiring layers 5 except a portion of the wiring layers 5. A hole 91 exposing a portion of the wiring layer 5 is provided in each first resist layer 9. The first resist layers 9 are each provided on the first surface 31 side of the resin molding 3 over the associated wiring layer 5 and the electrically insulating portion 7. The first resist layers 9 each have an electrically insulating property. The first resist layers 9 are made of a material having a lower solder wettability than the wiring layers 5. The first resist layers 9 are preferably, for example, polyimide layers.

The second resist layer 10 is provided on the second surface 32 side of the resin molding 3 so as to cover the second grounding wiring layers 13. Here, the second resist layer 10 is provided over the second grounding wiring layers 13 and the second surface 32 of the resin molding 3. The second resist layer 10 covers the second grounding wiring layers 13 except a portion of the second grounding wiring layers 13. A hole 101 exposing a portion of each second grounding wiring layer 13 is provided in the second resist layer 10. The second resist layer 10 has an electrically insulating property. The second resist layer 10 is made of a material having a lower solder wettability than the second grounding wiring layers 13. The second resist layer 10 is preferably, for example, a polyimide layer.

The third resist layers 11 are each provided on the first surface 31 side of the resin molding 3 so as to cover an associated one of the first grounding wiring layers 12 except a portion of the first grounding wiring layers 12. A hole 111 exposing a portion of the first grounding wiring layer 12 is provided in each third resist layer 11. The third resist layers 11 have an electrically insulating property. The third resist layers 11 are made of a material having a lower solder wettability than the first grounding wiring layers 12. The third resist layers 11 are preferably, for example, polyimide layers.

(2.7) Electrically Insulating Portion

The electrically insulating portion 7 has an electrically insulating property. The electrically insulating portion 7 includes a plurality of (two in the illustrated example) first intermediate layers (first electrically insulating portions) 71, a second intermediate layer (second electrically insulating portion) 72, and a third intermediate layer (third electrically insulating portion) 73.

Each first intermediate layer 71 covers the entire or substantially the entire side surface of an associated one of the columnar conductor pillars 4. The shape of each first intermediate layer 71 is preferably a cylindrical or substantially cylindrical shape. Each first intermediate layer 71 is in contact with the associated conductor pillar 4. The second intermediate layer 72 is provided along the first surface 31 of the resin molding 3 in contact with the wiring layers 5 and the shield portion 6. The second intermediate layer 72 electrically insulates the wiring layers 5 and the shield portion 6 from each other. The third intermediate layer 73 is in contact with the chip electronic component 2. More specifically, the third intermediate layer 73 covers the back surface 22 and side surface 23 of the chip electronic component 2. The plurality of first intermediate layers 71, the second intermediate layer 72, and the third intermediate layer 73 are integrally provided.

In the electronic component 1, the dielectric constant and dielectric loss tangent of the electrically insulating portion 7 are respectively less than the dielectric constant and dielectric loss tangent of the resin molding 3. Also, in the electronic component 1, the dielectric constant and dielectric loss tangent of the electrically insulating portion 7 are respectively less than the dielectric constant and dielectric loss tangent of a base material (in the case of an SAW filter, for example, a piezoelectric substrate) supporting the functional portion in the chip electronic component 2. The electrically insulating portion is made of an inorganic electrically insulating film. The inorganic electrically insulating film is made of an inorganic electrically insulating material. The inorganic electrically insulating material that is used for the electrically insulating film is preferably, for example, silicon oxide. The electrically insulating portion 7 is not limited to an inorganic electrically insulating film and may be an organic electrically insulating film. The material of the organic electrically insulating film is preferably, for example, a fluorine-based resin, bismaleimide, or the like.

(2.8) Shield Portion

The shield portion 6 is a shield layer providing electromagnetic shielding. The shield portion 6 includes a plurality of (two in the illustrated example) first conductor layers 61, a second conductor layer 62, and a third conductor layer 63.

Each first conductor layer 61 covers the entire or substantially the entire side surface of an associated one of the first intermediate layer 71. The shape of each first conductor layer 61 is preferably a cylindrical or substantially cylindrical shape. Each first conductor layer 61 is in contact with the first intermediate layer 71 and the resin molding 3. The second conductor layer 62 is provided along the first surface 31 of the resin molding 3 in contact with the resin molding 3 and the second intermediate layer 72. The third conductor layer 63 is provided along the side surface 23 and back surface 22 of the chip electronic component 2 in contact with the resin molding 3 and the third intermediate layer 73.

(2.9) Coaxial Structure

The electronic component 1 includes the conductor layers 60 each disposed coaxially with an associated one of the conductor pillars 4 so as to surround the side surface of the conductor pillar 4. In other words, the electronic component 1 has the coaxial structures 14 including the conductor pillar 4 and the conductor layer 60 disposed to surround the side surface of the conductor pillar 4 and spaced away from the side surface of the conductor pillar 4. The conductor layer 60 includes the first conductor layer 61 of the above-described shield portion 6. In the electronic component 1, each coaxial structure 14 further includes the intermediate layer 70 interposed between the conductor pillar 4 and the conductor layer 60. The intermediate layer 70 is an electrically insulating layer defined by the first intermediate layer 71 of the above-described electrically insulating portion 7. In the electronic component 1, the resin molding 3 covers the side surface of each conductor layer 60.

(2.10) First Grounding Wiring Layer and Second Grounding Wiring Layer

The first grounding wiring layers 12 are electrically connected to the shield portion 6. More specifically, the first grounding wiring layers 12 are in contact with the shield portion 6 and electrically connected to the conductor layers 60 on the first surface 31 side of the resin molding 3. The first grounding wiring layers 12 are each provided over the associated first resist layer 9 and a grounding conductor layer 65 on a side across the first conductor layer 61 from the second conductor layer 62 in the shield portion 6. The material of the first grounding wiring layers 12 is preferably, for example, Cu.

The second grounding wiring layers 13 are electrically connected to the shield portion 6. More specifically, the second grounding wiring layers 13 are each in contact with an associated one of the conductor layers 60 (first conductor layers 61) of the shield portion 6 and are each electrically connected to an associated one of the conductor layers 60 on the second surface 32 side of the resin molding 3. The second grounding wiring layers are each provided over the second surface 32 of the resin molding 3 and an end surface 612 on an opposite side of the conductor layer 60 (first conductor layer 61) from the second conductor layer 62 side. The material of the second grounding wiring layers 13 is preferably, for example, Cu.

(3) Manufacturing Method for Electronic Component

Next, a non-limiting example of a manufacturing method for the electronic component 1 according to the first preferred embodiment will be described with reference to FIGS. 3A to 3F, FIGS. 4A to 4F, and FIGS. 5A to 5D.

In the manufacturing method for the electronic component 1, after the chip electronic component 2 is prepared, a first process to a twelfth process are performed sequentially.

Figure 3A:
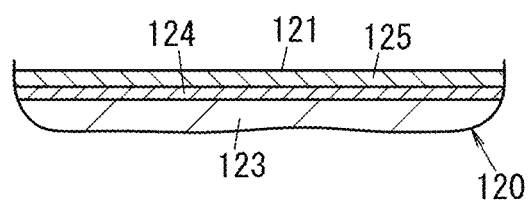
FIGS. 3A to 3C are process cross-sectional views for illustrating a manufacturing method for the above-described electronic component.

In the first process, as shown in FIG. 3A, a support 120 is prepared. The support 120 includes a planar base 123, and an electrically conductive layer 125 bonded to one surface of the base 123 in the thickness direction by an adhesion layer 124.

Figure 3B:
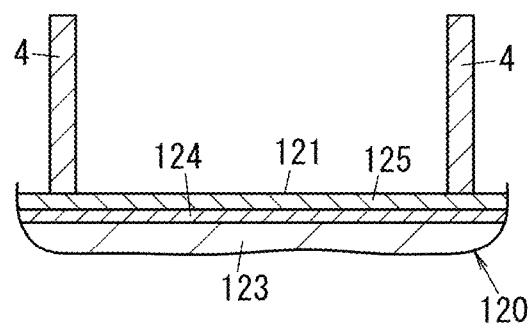

In the second process, as shown in FIG. 3B, the plurality of conductor pillars 4 are formed on the electrically conductive layer 125 of the support 120. In this process, first, a positive photoresist layer that covers the electrically conductive layer 125 of the support 120 is formed. After that, portions of the electrically conductive layer 125, which will be beds for the conductor pillars 4, are exposed by removing portions at positions where the conductor pillars 4 will be formed in the photoresist layer by using a photolithography technique (forming hole portions at positions where the conductor pillars 4 will be formed). After that, the conductor pillars 4 are formed by electrolytic plating. In forming the conductor pillars 4, the conductor pillars 4 are deposited from the exposed surfaces of the electrically conductive layer 125 along the thickness direction of the photoresist layer by passing current between an anode opposed to the surface of the photoresist layer via a plating solution containing copper sulfate and a cathode made up of the electrically conductive layer 125. After that, the photoresist layer is removed. In the manufacturing method for the electronic component 1 according to the first preferred embodiment, the second process is a pillar forming process of forming the pillars 4 having an electrical conductivity on the surface 121 of the support 120. The surface 121 of the support 120 is the surface of the electrically conductive layer 125.

Figure 3C:
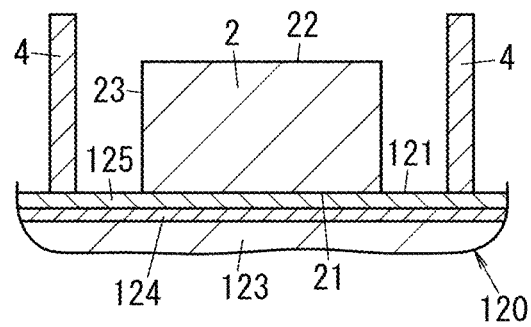

In the third process, as shown in FIG. 3C, the chip electronic component 2 is temporarily fixed on the electrically conductive layer 125 of the support 120, on which the conductor pillars 4 are formed. More specifically, first, a liquid (pasty) resin adhesion layer (not shown) is formed on the electrically conductive layer 125. Subsequently, the front surface 21 of the chip electronic component 2 faces the resin adhesion layer, and the chip electronic component 2 is pressed against the resin adhesion layer. Thus, in the third process, the chip electronic component 2 is temporarily fixed to the electrically conductive layer 125 via the resin adhesion layer. The resin adhesion layer is preferably formed by a photosensitive positive resist. In the manufacturing method for the electronic component 1 according to the first preferred embodiment, the third process is a component disposing process. In other words, in the component disposing process, the chip electronic component 2 is disposed on the surface 121 of the support 120 (temporarily fixed on the support 120) at a position spaced away from the side surfaces of the conductor pillars 4. Here, in the component disposing process, the chip electronic component 2 is disposed on the surface 121 of the support 120 by facing the front surface 21 of the chip electronic component 2 to the surface 121 of the support 120.

In the fourth process, as shown in FIG. 4A, an electrically insulating layer 700 defining the electrically insulating portion 7 (see FIG. 1A) is formed. More specifically, in the fourth process, the electrically insulating layer 700 that covers the exposed portion of the surface 121 of the support 120, the side surfaces and distal end surfaces of the conductor pillars 4, and the side surface 23 and back surface 22 of the chip electronic component 2 is formed. The electrically insulating layer 700 includes fourth intermediate layers 74 each covering the distal end surface of the conductor pillar 4, in addition to the intermediate layers 70 (first intermediate layers 71), the second intermediate layer 72, and the third intermediate layer 73. The material of the electrically insulating layer 700 is preferably, for example, silicon oxide. In the fourth process, the electrically insulating layer 700 is formed by, for example, CVD (chemical vapor deposition). Thus, in the fourth process, the first intermediate layers 71, the second intermediate layer 72, the third intermediate layer 73, and (the fourth intermediate layers 74) can be integrally formed. In the fourth process, not limited to CVD, the electrically insulating layer 700 may be formed by, for example, sputtering, spray coating, or the like. In the manufacturing method for the electronic component 1 according to the first preferred embodiment, the fourth process is an intermediate layer forming process of forming the intermediate layers 70 so as to cover the side surface of the conductor pillar 4.

In the fifth process, as shown in FIG. 4B, a metal layer 600 that defines the shield portion 6 (see FIG. 1A) is formed. More specifically, in the fifth process, the metal layer 600 is formed on the electrically insulating layer 700. The metal layer 600 includes fourth conductor layers 64 in addition to the conductor layers 60 (first conductor layers 61), the second conductor layer 62, and the third conductor layer 63. The fourth conductor layers 64 are each formed so as to cover the fourth intermediate layer 74. The material of the metal layer 600 is preferably, for example, Cu. In the fifth process, the metal layer 600 is formed by, for example, CVD. Thus, in the fifth preferred embodiment, the first conductor layers 61, the second conductor layer 62, the third conductor layer 63, and (the fourth conductor layers 64) can be integrally formed. In the fifth process, not limited to CVD, the metal layer 600 may be formed by, for example, sputtering (for example, oblique sputtering), evaporation (for example, oblique evaporation), spray coating, electroless plating, or the like. In the manufacturing method for the electronic component 1 according to the first preferred embodiment, the fifth process is a conductor layer forming process of forming the conductor layers 60 so as to cover the side surface of the intermediate layer 70.

In the sixth process, as shown in FIG. 4C, a resin structure 30 that defines the resin molding 3 (see FIG. 4D) is formed on the support 120. Here, in the sixth process, the resin structure 30 is formed on the support 120 so as to cover the metal layer 600 covering the electrically insulating layer 700. In short, in the sixth process, the resin structure 30 is formed on the electrically conductive layer 125 of the support 120 via the electrically insulating layer 700 and the metal layer 600. Here, the resin structure 30 includes a first surface 301 and a second surface 302 that are on opposite sides in the thickness direction. The first surface 301 of the resin structure 30 is a surface that contacts the second conductor layer 62 of the metal layer 600. The resin structure 30 covers the back surface 22 and side surface 23 of the chip electronic component 2 via the metal layer 600 and the electrically insulating layer 700. Furthermore, the resin structure 30 covers the side surfaces and distal end surfaces of the conductor pillars 4 via the metal layer 600 and the electrically insulating layer 700. Therefore, the resin structure 30 is thicker than the resin molding 3, a portion of the resin structure 30, a portion of the metal layer 600, and a portion of the electrically insulating layer 700 are interposed between the second surface 302 of the resin structure 30 and the distal end surfaces of the conductor pillars 4.

In the sixth process, the resin structure 30 is molded by press molding. A method of forming the resin structure 30 is not limited to press molding. In the sixth process, for example, the resin structure 30 may be molded using spin coating, transfer molding, or the like. In the manufacturing method for the electronic component 1 according to the first preferred embodiment, the sixth process is a resin molding process of molding the resin structure 30 so as to cover the side surfaces of the conductor layers 60.

In the seventh process, as shown in FIG. 4D, the resin molding 3 is formed by grinding the resin structure 30 from the second surface 302 side opposite from the first surface 301 until the thickness of the resin molding 3 is obtained. In short, in the seventh process, the resin structure 30 is ground such that the distal end surfaces of the conductor pillars 4 are exposed and the second surface 302 (see FIG. 4C) of the resin structure 30 (see FIG. 4C) is flush or substantially flush with the distal end surfaces of the conductor pillars 4. In the seventh process, the distal end surfaces of the conductor pillars 4 are exposed. However, making the distal end surfaces of the conductor pillars 4 and the second surface 302 of the resin structure 30 flush or substantially flush with each other is not required. Through the seventh process, a structure including the resin molding 3, the conductor pillars 4, the electrically insulating portion 7, and the shield portion is formed. In the manufacturing method for the electronic component 1 according to the first preferred embodiment, the seventh process is a grinding process. The grinding process is performed after the resin molding process. In the grinding process, the resin structure 30 is ground such that the distal end surfaces of the conductor pillars 4 are exposed.

In the eighth process, as shown in FIG. 4E, the support 120 and the resin adhesion layer are removed from the structure including the chip electronic component 2, the resin molding 3, the conductor pillars 4, the electrically insulating portion 7, the shield portion 6, the support 120, and the resin adhesion layer (not shown). Thus, in the eighth process, the front surface 21 of the chip electronic component 2, both end surfaces (the first end surface 41 and the second end surface 42) of each conductor pillar 4, a portion of the electrically insulating portion 7, and a portion of the shield portion 6 are exposed. In the eighth process, for example, the adhesion of the adhesion layer 124 (see FIG. 4D) bonding the electrically conductive layer 125 (see FIG. 4D) and the base 123 (see FIG. 4D) is decreased, and the base 123 on the support 120 is removed (peeled). The adhesion layer 124 is preferably made from an adhesive of which the adhesion can be decreased by any one of ultraviolet rays, infrared rays, and heat. The electrically conductive layer 125 can be removed by, for example, wet etching. Alternatively, in the eighth process, the resin adhesion layer can be removed by exposing the resin adhesion layer to light and then developing the resin adhesion layer. In the manufacturing method for the electronic component 1 according to the first preferred embodiment, the eighth process is a removing process of removing the support 120.

In the ninth process, as shown in FIG. 4F, the plurality of wiring layers 5 each electrically connecting the chip electronic component 2 to the associated conductor pillar 4 are formed. In the ninth process, the wiring layers 5 are formed by using, for example, sputtering or plating, a photolithography technique, and an etching technique. In the manufacturing method for the electronic component 1 according to the first preferred embodiment, the ninth process is a wiring layer forming process. In the wiring layer forming process, the wiring layers 5 each electrically connecting the chip electronic component 2 to the associated conductor pillar 4 are formed.

Also, in the ninth process, as shown in FIG. 4F, the plurality of second grounding wiring layers 13 are formed. In the ninth process, the second grounding wiring layers 13 are formed by using, for example, sputtering or plating, a photolithography technique, and an etching technique.

Figure 5A:
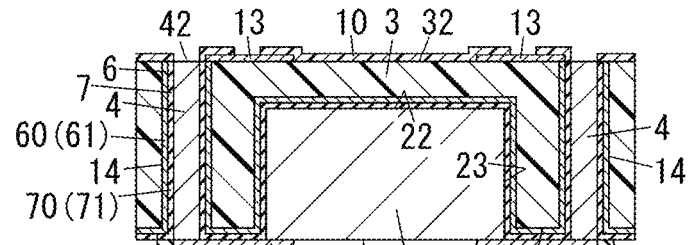
FIGS. 5A to 5D are process cross-sectional views for illustrating a manufacturing method for the above-described electronic component.

In the tenth process, as shown in FIG. 5A, the first resist layers 9 and the second resist layer 10 are formed. In the tenth process, the first resist layers 9 and the second resist layer 10 are formed using, for example, a coating technique, such as spin coating, and a photolithography technique.

Figure 5B:
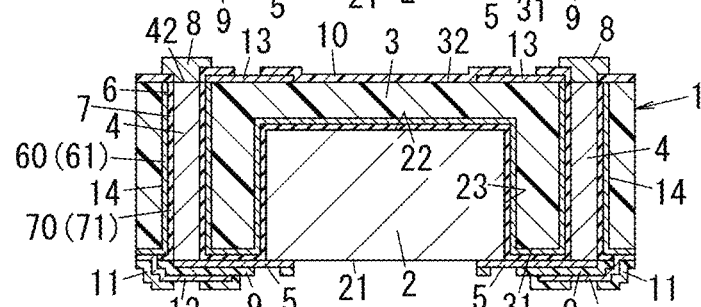

In the eleventh process, as shown in FIG. 5B, each of the plurality of electrodes 8 that are in a one-to-one correspondence with the plurality of conductor pillars 4 is formed on the second end surface 42 of an associated one of the plurality of conductor pillars 4. More specifically, in the eleventh process, the electrodes 8 are formed using, for example, a thin film forming technique, such as sputtering, a photolithography technique, and an etching technique.

Also, in the eleventh process, as shown in FIG. 5B, the first grounding wiring layers 12 are formed, and then the third resist layers 11 are formed. More specifically, in the eleventh process, the first grounding wiring layers 12 are each formed on the associated first resist layer 9 using, for example, a thin film forming technique, such as sputtering, a photolithography technique, and an etching technique. After that, in the eleventh process, the third resist layers 11 are formed using, for example, a coating technique, such as spin coating, and a photolithography technique.

In the manufacturing method for the electronic component 1 according to the first preferred embodiment, when the support 120 having such a size that an aggregate of a plurality of the electronic components 1 can be formed is used as the support 120 in the first process, the aggregate of the plurality of electronic components 1 can be formed by performing the first process to the eleventh process. In this case, the plurality of electronic components 1 can be obtained by, for example, cutting the aggregate of the plurality of electronic components 1 into the individual electronic components 1 with a dicing machine.

In manufacturing an electronic component module 200 (see FIG. 5D) including the electronic component 1, a plurality of the electronic component modules 200 can be obtained by, after the eleventh process, performing the following twelfth process and thirteenth process and then separating the electronic component modules 200 into the individual electronic component modules 200.

Figure 5C:
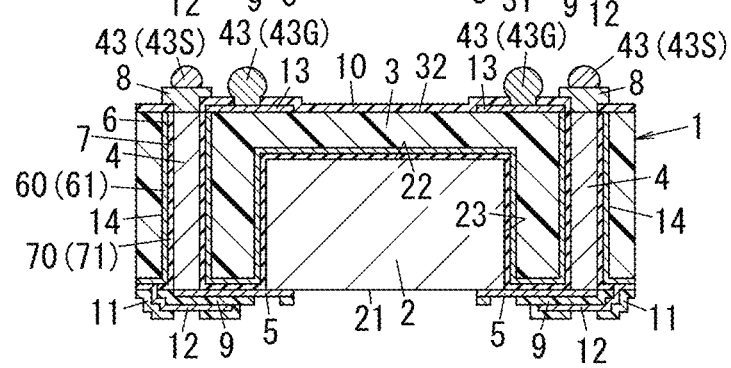
Figure 5D:
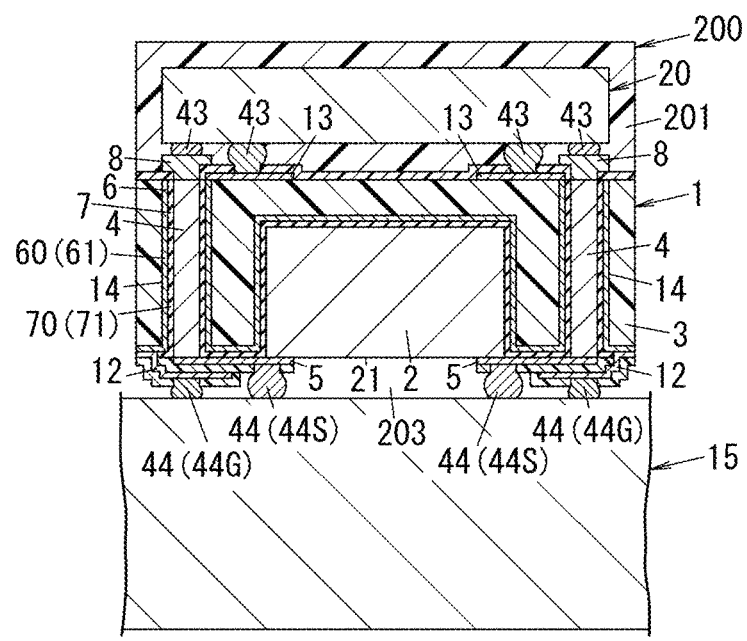

In the twelfth process, as shown in FIG. 5C, the electrically conductive bumps 43 are formed on the electronic component 1. After that, in the thirteenth process, as shown in FIG. 5D, the terminal electrodes of the electronic component 20 and the electrodes 8 of the electronic component 1 are electrically and mechanically connected via the electrically conductive bumps 43 (43S), and the grounding electrodes of the electronic component 20 and the second grounding wiring layers 13 of the electronic component 1 are electrically and mechanically connected via the electrically conductive bumps 43 (43G). After that, in the thirteenth process, a cover layer 201 that covers the electronic component 20 is formed. For example, polyimide resin, benzocyclobutene, polybenzoxazole, phenolic resin, or silicone resin may be used as the material of the cover layer 201. The cover layer 201 defines and functions as a sealing layer that seals the electronic component 20 on the electronic component 1. In the thirteenth process, after the cover layer 201 is formed, the electrically conductive bumps 44 (44S) that are electrically connected to the wiring layers 5 of the electronic component 1 and the electrically conductive bumps 44 (44G) that are electrically connected to the first grounding wiring layers 12 are formed. The above-described electrically conductive bumps 43, 44 are, preferably, for example, solder bumps. The electrically conductive bumps 43, 44 are not limited to solder bumps and may be, for example, gold bumps.

In the thirteenth process, for example, after the electrically conductive bumps 44 are formed, the electronic component modules 200 are separated into the individual electronic component modules 200. After that, as shown in FIG. 5D, the electronic component module 200 is mounted on the circuit board 15. In the electronic component module 200, the gap 203 is formed between the front surface 21 of the chip electronic component 2 and the circuit board 15.

(4) Advantageous Effects

The manufacturing method for the electronic component 1 according to the first preferred embodiment includes the pillar forming process of forming the conductor pillars 4 on the surface 121 of the support 120, the intermediate layer forming process of forming the intermediate layers 70 each covering the side surface of an associated one of the conductor pillars 4, a conductor layer forming process of forming the conductor layers 60 each covering the side surface of an associated one of the intermediate layers 70, and a resin molding process of molding the resin structure 30 covering the side surfaces of the conductor layers 60. Thus, with the manufacturing method for the electronic component 1 according to the first preferred embodiment, the electronic component 1 having the coaxial structures 14 each including the conductor pillar 4 and the conductor layer 60 can be more easily manufactured. This point will be further described. In the manufacturing method for the electronic component 1 according to the first preferred embodiment, the conductor pillars 4 are formed first, then the intermediate layers 70 are each formed so as to cover the side surface of the associated conductor pillar 4, and, after that, the conductor layers 60 are each formed so as to cover the side surface of the associated intermediate layer 70. Thus, with the manufacturing method for the electronic component 1 according to the first preferred embodiment, in comparison with the case where, like the existing manufacturing method for an electronic component, a filler is filled into through-holes and then through-holes for forming signal via conductors (conductor vias) are formed in the filler, the coaxial structures 14 can be easily formed even when the aspect ratio of each conductor pillar 4 increases. In addition, the electronic component 1 manufactured through the manufacturing method for the electronic component 1 according to the first preferred embodiment has, for example, an advantage in that the conductor pillars 4 are insusceptible to electromagnetic waves from the outside and an advantage that propagation losses of radio-frequency signals passing through the conductor pillars 4 can be reduced or prevented. With the manufacturing method in which metallized ink is printed in through-holes of a plurality of raw sheets (green sheets), the plurality of raw sheets are laminated and pressure-bonded, and then fired in order to form coaxial structures, the position of a grounding via conductor, surrounding a signal via conductor, with respect to the signal via conductor easily deviates in the coaxial structure, and there are concerns that the electromagnetic shielding performance of the coaxial structure decreases. In contrast to this, with the manufacturing method for the electronic component 1 according to the first preferred embodiment, the intermediate layers 70 are each laminated on the associated conductor pillar 4 and then the conductor layer 60 is laminated on the intermediate layer 70, such that the accuracy of relative positions between the conductor pillar 4 and the conductor layer 60 can be improved, and the conductor pillar 4 is even more insusceptible to electromagnetic waves from the outside.

In the manufacturing method for the electronic component 1 according to the first preferred embodiment, the removing process of removing the support 120 after the resin molding process is further provided. Thus, with the manufacturing method for the electronic component 1 according to the first preferred embodiment, the end surface of each coaxial structure 14 on the support 120 side can be exposed. Another element can be electrically connected to each of the conductor pillar 4 and the conductor layer 60 on the end surface of the coaxial structure 14 on the support 120 side.

The manufacturing method for the electronic component 1 according to the first preferred embodiment further includes the component disposing process between the pillar forming process and the intermediate layer forming process, and the wiring layer forming process after the removing process. In the component disposing process, the chip electronic component 2 is disposed on the surface 121 of the support 120 at a position spaced away from the side surfaces of the conductor pillars 4. In the wiring layer forming process, the wiring layers 5 each electrically connecting the chip electronic component 2 to the associated conductor pillar are formed. Thus, with the manufacturing method for the electronic component 1 according to the first preferred embodiment, the electronic component 1 including the coaxial structures 14, the chip electronic component 2, and the wiring layers 5 can be even more easily manufactured.

In the manufacturing method for the electronic component 1 according to the first preferred embodiment, in the component disposing process, the chip electronic component 2 is disposed on the surface 121 of the support 120 such that the front surface 21 of the chip electronic component 2 faces the surface 121 of the support 120. In the intermediate layer forming process, the first intermediate layers 71 that are the intermediate layers 70, the second intermediate layer 72 covering the exposed region of the surface 121 of the support 120, and the third intermediate layer 73 covering both the back surface 22 and exposed region of the side surface 23 of the chip electronic component 2 are integrally formed. In the intermediate layer forming process, the first intermediate layers 71, the second intermediate layer 72, and the third intermediate layer 73 are integrally formed by forming the first intermediate layers 71, the second intermediate layer 72, and the third intermediate layer 73 substantially at the same time in one process by using the same material. Thus, with the manufacturing method for the electronic component 1, no interface is formed between the first intermediate layers 71 and the second intermediate layer 72 or between the second intermediate layer 72 and the third intermediate layer 73, such that a rupture of the electrically insulating portion 7 due to thermal stress, or the like, is less likely to occur. Therefore, with the manufacturing method for the electronic component 1, the electronic component 1 having a highly reliable electrically insulating property can be manufactured.

In the manufacturing method for the electronic component 1 according to the first preferred embodiment, in the conductor layer forming process, the first conductor layers 61 that are the conductor layers 60, the second conductor layer 62 covering the second intermediate layer 72, and the third conductor layer 63 covering the third intermediate layer 73 are integrally formed. In the conductor layer forming process, the first conductor layers 61, the second conductor layer 62, and the third conductor layer 63 are integrally formed by forming the first conductor layers 61, the second conductor layer 62, and the third conductor layer 63 substantially at the same time in one process by using the same material. Thus, with the manufacturing method for the electronic component 1, no interface is formed between the first conductor layers 61 and the second conductor layer 62 or between the second conductor layer 62 and the third conductor layer 63, such that a rupture of the shield portion 6 due to thermal stress, or the like, is less likely to occur. Therefore, with the manufacturing method for the electronic component 1, the electronic component 1 having highly reliable electromagnetic shielding performance can be manufactured. With the electronic component module 200 (see FIG. 5D) or electronic component module 210, including the electronic component 1 manufactured by the manufacturing method for the electronic component 1, the electromagnetic shielding performance in the first direction D1 can be improved by the third conductor layer 63, such that a distance between the electronic component 1 and the other electronic component 20 in the first direction D1 can be further reduced, and low profile is achieved.

In the manufacturing method for the electronic component 1 according to the first preferred embodiment, in the resin molding process, the resin structure 30 is molded so as to cover the first conductor layers 61, the second conductor layer 62, and the third conductor layer 63 on the surface 121 side of the support 120. The manufacturing method for the electronic component 1 further includes the grinding process of grinding the resin structure 30 such that the distal end surface of each conductor pillar 4 is exposed. Thus, with the manufacturing method for the electronic component 1, the coaxial structures 14 each including the conductor pillar 4 can be exposed by grinding the resin structure 30. Therefore, with the manufacturing method for the electronic component 1, the conductor pillars 4 and the first conductor layers 61 can be exposed without projecting from the resin structure 30. The ground resin structure 30 is the resin molding 3.

In the manufacturing method for the electronic component 1 according to the first preferred embodiment, the intermediate layers 70 are each an electrically insulating layer. Thus, with the manufacturing method for the electronic component 1, the electrically insulating layer can be interposed between the conductor pillar 4 and the conductor layer 60 as the intermediate layer 70. With the manufacturing method for the electronic component 1 according to the first preferred embodiment, the accuracy of coaxiality between the conductor pillar 4 and the conductor layer 60 can be improved.

In the manufacturing method for the electronic component 1 according to the first preferred embodiment, in the conductor layer forming process, the conductor layers 60 are formed by CVD or sputtering, for example. Thus, with the manufacturing method for the electronic component 1, uniformity in the thickness of each conductor layer 60 can be improved. Also, with the manufacturing method for the electronic component 1, by forming the conductor layers 60 with CVD in the conductor layer forming process, uniformity in the thickness of each conductor layer 60 can be improved as compared to, for example, when each conductor layer 60 is formed by sputtering.

In the manufacturing method for the electronic component 1 according to the first preferred embodiment, in the intermediate layer forming process, the intermediate layers 70 are formed by CVD, sputtering, or spray coating, for example. Thus, with the manufacturing method for the electronic component 1, uniformity in the thickness of each intermediate layer 70 can be improved.

In the manufacturing method for the electronic component 1 according to the first preferred embodiment, the support 120 includes the electrically conductive layer 125. In the pillar forming process, the conductor pillars 4 are formed on the electrically conductive layer 125 by plating. Thus, with the manufacturing method for the electronic component 1, the conductor pillars 4 can be easily formed.

The electronic component 1 according to the first preferred embodiment includes the conductor pillars 4, the conductor layers 60, the intermediate layers 70 made of the electrically insulating layer, and the resin molding 3. The conductor layers 60 are each disposed so as to surround the side surface of an associated one of the conductor pillars 4. The conductor layers 60 are each spaced away from the side surface of the associated conductor pillar 4. The resin molding 3 covers the side surfaces of the conductor layers 60.

The electronic component 1 according to the first preferred embodiment can be more easily manufactured than the electronic component having existing coaxial structures. Since the electronic component 1 according to the first preferred embodiment has the coaxial structures 14 each including the conductor pillar 4 and the conductor layer 60, the electronic component 1 has an advantage that the conductor pillars 4 are insusceptible to electromagnetic waves from the outside and an advantage that propagation losses of radio-frequency signals passing through the conductor pillars 4 can be reduced or prevented.

The electronic component 1 according to the first preferred embodiment further includes the intermediate layers 70 each made of an electrically insulating layer interposed between the conductor pillar 4 and the conductor layer 60. Thus, with the electronic component 1, manufacturing is facilitated, and the coaxiality between each conductor pillar 4 and the associated conductor layer 60 can be improved.

The electronic component 1 according to the first preferred embodiment further includes the chip electronic component 2 spaced away from the side surfaces of the conductor layers 60. The resin molding 3 covers the side surfaces of the conductor layers 60, and the back surface 22 and at least a portion of the side surface 23 of the chip electronic component 2. Thus, with the electronic component 1, even for, for example, a component that generates electromagnetic waves while the chip electronic component 2 is in operation, radio-frequency signals passing through the conductor pillars 4 are insusceptible to electromagnetic waves from the chip electronic component 2.

The electronic component 1 according to the first preferred embodiment further includes the wiring layers 5 each electrically connecting the chip electronic component 2 and the associated conductor pillar 4. The electronic component 1 is able to pass radio-frequency signals via the wiring layers 5 between the chip electronic component 2 and the conductor pillars 4. With the electronic component 1, each conductor pillar 4 is surrounded by the conductor layer 60, so radio-frequency signals that pass through the wiring layers 5 and the conductor pillars 4 are insusceptible to electromagnetic waves from the chip electronic component 2. As a result, the wiring length of each wiring layer can be further reduced, such that miniaturization of the electronic component 1 can be achieved.

In the electronic component 1 according to the first preferred embodiment, the dielectric constant and dielectric loss tangent of the electrically insulating portion 7 are respectively less than the dielectric constant and dielectric loss tangent of the resin molding 3, and the dielectric constant and dielectric loss tangent of the electrically insulating portion 7 are respectively less than the dielectric constant and dielectric loss tangent of the base material (in the case of an SAW filter, for example, a piezoelectric substrate) supporting the functional portion (such as an interdigital transducer electrode and a terminal electrode) in the chip electronic component 2. Thus, with the electronic component 1, a parasitic capacitance that occurs between the conductor layer 60 of each coaxial structure 14 and the associated wiring layer 5 and a parasitic capacitance that occurs between each conductor layer 60 and the functional portion of the chip electronic component 2 can be reduced or prevented.

(5) Modifications
(5.1) First Modification

Figure 6:
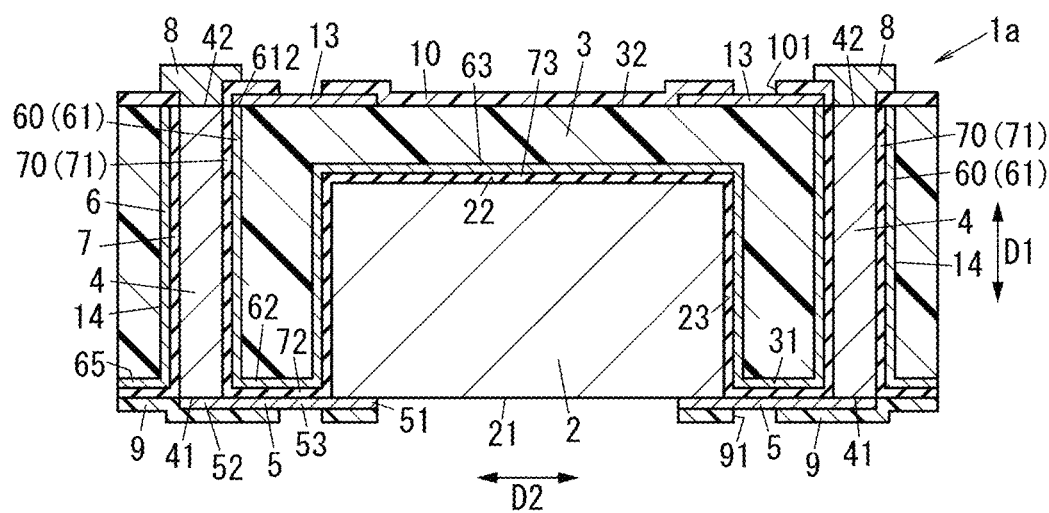
FIG. 6 is a cross-sectional view of an electronic component according to a first modification of the first preferred embodiment of the present invention.

As shown in FIG. 6, an electronic component 1a according to a first modification of the first preferred embodiment differs from the electronic component 1 according to the first preferred embodiment in that the first grounding wiring layers 12 and the third resist layers 11 in the electronic component 1 (see FIG. 1A) according to the first preferred embodiment are not provided. As for the electronic component 1a according to the first modification, the same reference numerals denote the same or similar elements to those of the electronic component 1 according to the first preferred embodiment, and the description thereof is omitted.

In the electronic component 1a according to the first modification, the first grounding wiring layers 12 and the third resist layers 11 are not provided, such that manufacturing is facilitated as compared to the electronic component 1 of the first preferred embodiment.

(5.2) Second Modification

Figure 7:
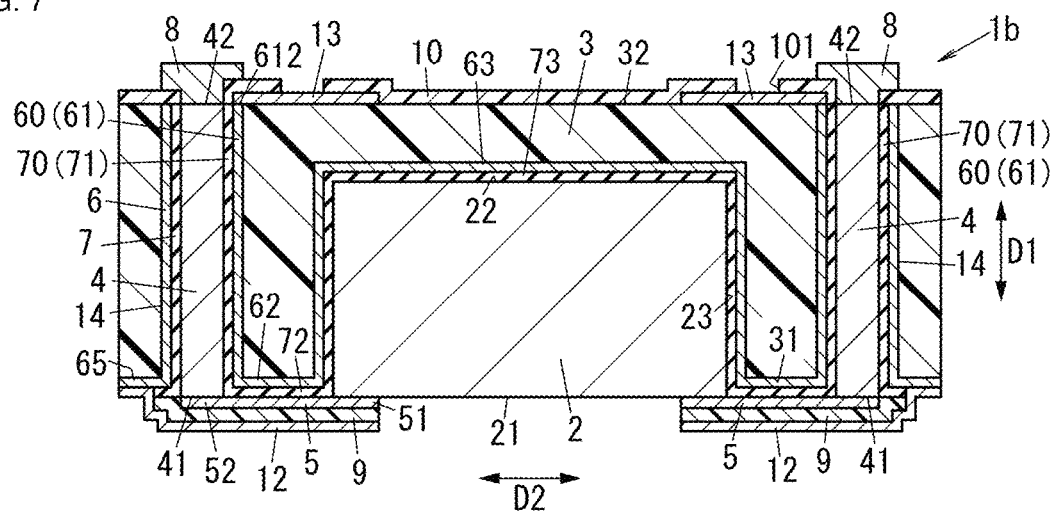
FIG. 7 is a cross-sectional view of an electronic component according to a second modification of the first preferred embodiment of the present invention.

As shown in FIG. 7, an electronic component 1b according to a second modification of the first preferred embodiment differs from the electronic component 1 according to the first preferred embodiment in that the first resist layers 9 each cover the entire or substantially the entire wiring layer 5 and the first grounding wiring layers 12 each cover the entire or substantially the entire first resist layer 9. As for the electronic component 1b according to the second modification, the same reference numerals denote the same or similar elements to those of the electronic component 1 of the first preferred embodiment, and the description thereof is omitted.

With the electronic component 1b according to the second modification, radio-frequency signals that pass through the wiring layers 5 are insusceptible to electromagnetic waves from the outside of the electronic component 1b. Thus, with the electronic component 1b according to the second modification, further improved characteristics are obtained. A manufacturing method for the electronic component 1b according to the second modification is the same as or similar to the manufacturing method for the electronic component 1 according to the first preferred embodiment, and only the pattern of a photomask at the time of forming the first resist layers 9 and the pattern of a photomask at the time of forming the first grounding wiring layers 12 are varied.

(5.3) Third Modification

Figure 8:
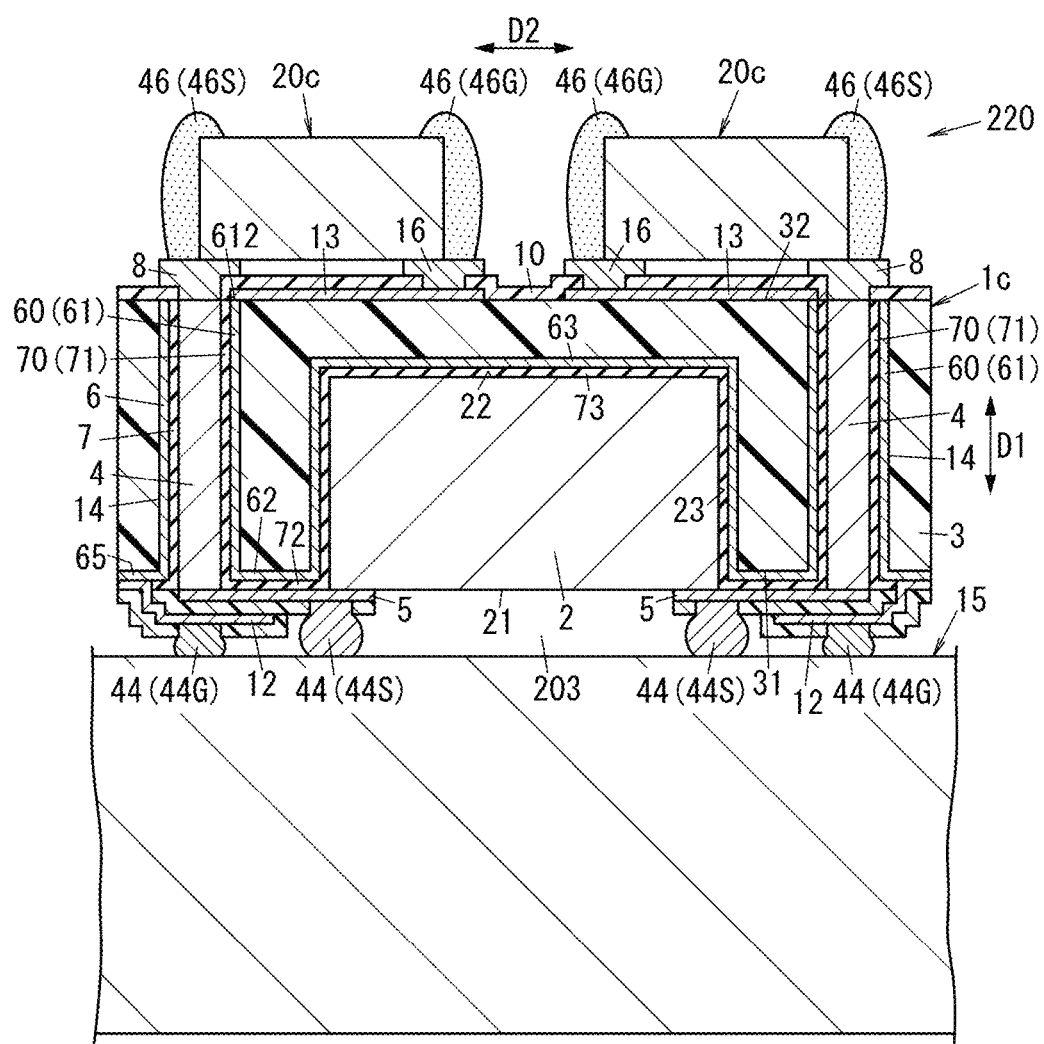
FIG. 8 is a cross-sectional view of an electronic component according to a third modification of the first preferred embodiment of the present invention.

As shown in FIG. 8, an electronic component 1c according to a third modification of the first preferred embodiment differs from the electronic component 1 according to the first preferred embodiment in that the overall length (wiring length) of each second grounding wiring layer 13 in the second direction D2 is elongated so that two electronic components 20c arranged in the second direction D2 can be mounted. In addition, the electronic component 1c according to the third modification differs from the electronic component 1 according to the first preferred embodiment in that electrodes 16 are provided in a region not covered with the second resist layer 10 in the in the second grounding wiring layers 13. As for the electronic component 1c according to the third modification, the same reference numerals denote the same or similar elements to those of the electronic component 1 of the first preferred embodiment, and the description thereof is omitted.

In an electronic component module 220 including the electronic component 1c according to the third modification and the two electronic components 20c, each electronic component 20c is electrically and mechanically connected to the electronic component 1c by bonding the terminal electrode of each electronic component 20c to the electrode 8 of the electronic component 1c by the bonding portion 46 (46S), and each electronic component 20c is electrically and mechanically connected to the electronic component 1c by bonding the ground electrode of each electronic component 20c to the electrode 16 of the electronic component 1c by the bonding portion 46 (46G). The bonding portions 46 are preferably made from an electrically conductive adhesive (for example, conductive paste). The electronic component module 220 includes the circuit board 15. However, in the electronic component module 220, the circuit board 15 is not required.

With the electronic component module 220, interference due to electromagnetic waves between the electronic component 1c and each electronic component 20c can be reduced or prevented.

A manufacturing method for the electronic component 1c according to the third modification is similar to the manufacturing method for the electronic component 1 according to the first preferred embodiment, and differs in that the electrodes 16 are also formed at the time of forming the electrodes 8.

(5.4) Other Modifications

In the electronic component 1 according to the first preferred embodiment, the second surface 32 of the resin molding 3 has a planar shape, and a shortest distance from the second surface 32 of the resin molding 3 to the front surface 21 of the chip electronic component 2 is longer than a shortest distance from the second surface 32 to the first surface 31. Thus, with the electronic component 1 according to the first preferred embodiment, low profile is achieved.

In contrast to this, as a modification of the first preferred embodiment, the second surface 32 of the resin molding 3 may have a planar shape, and a distance from the second surface 32 of the resin molding 3 to the front surface 21 of the chip electronic component 2 may be shorter than a distance from the second surface 32 of the resin molding 3 to the first surface 31 of the resin molding 3. Thus, with the electronic component 1 according to this modification, flaws are unlikely to be formed on the front surface 21 of the chip electronic component 2.

As another modification of the first preferred embodiment, the second surface 32 of the resin molding 3 may have a planar shape, and a distance from the second surface 32 of the resin molding 3 to the front surface 21 of the chip electronic component 2 may be equal or substantially equal to a distance from the second surface 32 of the resin molding 3 to the first surface 31 of the resin molding 3.

In short, the resin molding 3 preferably covers at least a portion of the side surface 23 of the chip electronic component 2. The phrase "cover at least a portion of the side surface 23 of the chip electronic component 2" means that, as for the side surface 23 of the chip electronic component 2, the side surface 23 is at least covered all around from a position, shifted from the front surface 21-side first end of the side surface 23 of the chip electronic component 2 toward the back surface 22-side second end side, to the boundary between the side surface 23 and the back surface 22, and includes the case where all of the side surface 23 of the chip electronic component 2 is covered.

The third conductor layer 63 is not limited to the case where the third conductor layer 63 covers the entire or substantially the entire surface of the third intermediate layer 73, and, for example, one or plurality of holes may be provided in the third conductor layer 63.

In the example of FIG. 1A, for the single chip electronic component 2, the electronic component 1 includes the two wiring layers 5 directly connected to the chip electronic component 2. However, the number of the wiring layers 5 is not limited to two. The number of the wiring layers 5 may be one or may be three or more. In addition, the number of the conductor pillars 4 is not limited to two. The number of the conductor pillars 4 may be one or may be three or more. In the electronic component 1, when the plurality of conductor pillars 4 are, for example, arranged in a direction (third direction) perpendicular or substantially perpendicular to the first direction D1 and the second direction D2, the plurality of coaxial structures 14 is also arranged in the third direction, so a distance between any adjacent conductor pillars 4 in the third direction can be reduced.

With the electronic components 1 according to the above-described modifications, the same or similar advantageous effects to those of the electronic component 1 according to the first preferred embodiment are obtained.

Figure 9A:
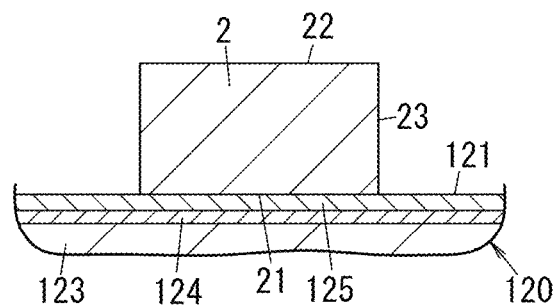
FIGS. 9A to 9D are process cross-sectional views for illustrating another manufacturing method for an electronic component according to the first preferred embodiment of the present invention.
Figure 9B:
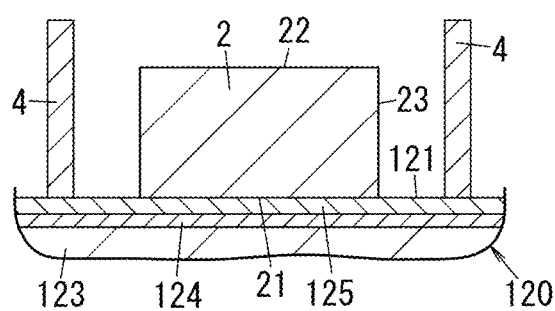

The manufacturing method for the electronic component 1 according to the first preferred embodiment is one example, and, in another manufacturing method for the electronic component 1 according to the first preferred embodiment, the above-described second process (pillar forming process) and third process (component disposing process) are preferably reversed in order. Therefore, with the above-described other manufacturing method, a component disposing process of disposing the chip electronic component 2 on the surface 121 of the support 120 is performed as shown in FIG. 9A, and then the pillar forming process of forming the pillars 4 having electrical conductivity on the surface 121 of the support 120 as shown in FIG. 9B. Here, in the component disposing process, the chip electronic component 2 is temporarily fixed on the electrically conductive layer 125 of the support 120. More specifically, first, a liquid (pasty) resin adhesion layer (not shown) is formed on the electrically conductive layer 125. Subsequently, the front surface 21 of the chip electronic component 2 is disposed to face to the resin adhesion layer, and the chip electronic component 2 is pressed against the resin adhesion layer. Thus, in the component disposing process, the chip electronic component 2 is temporarily fixed to the electrically conductive layer 125 via the resin adhesion layer. In the pillar forming process, the pillars 4 are disposed on the surface 121 of the support 120 at positions spaced away from the side surface 23 of the chip electronic component 2 as shown in FIG. 9B. More specifically, in the pillar forming process, the plurality of conductor pillars 4 are formed on the electrically conductive layer 125 of the support 120. In this process, first, a positive photoresist layer that covers the exposed region of the electrically conductive layer 125 of the support 120 and the chip electronic component 2 is formed. After that, portions of the electrically conductive layer 125, which will be beds for the conductor pillars 4, are exposed by removing portions at positions where the conductor pillars 4 will be formed in the photoresist layer by using a photolithography technique (forming hole portions at positions where the conductor pillars 4 will be formed). After that, the conductor pillars 4 are formed by electrolytic plating. In forming the conductor pillars 4, the conductor pillars 4 are deposited from the exposed surfaces of the electrically conductive layer 125 along the thickness direction of the photoresist layer by passing current between an anode opposed to the surface of the photoresist layer via a plating solution containing copper sulfate and a cathode defined by the electrically conductive layer 125. After that, the photoresist layer is removed.

Figure 9C:
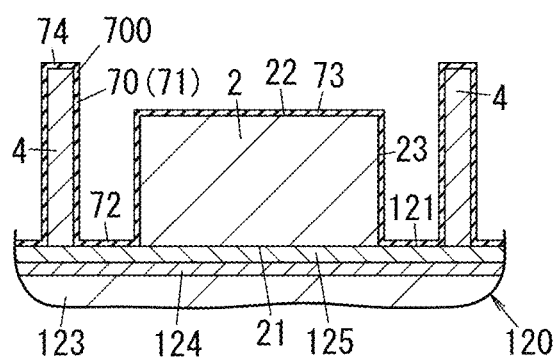
Figure 9D:
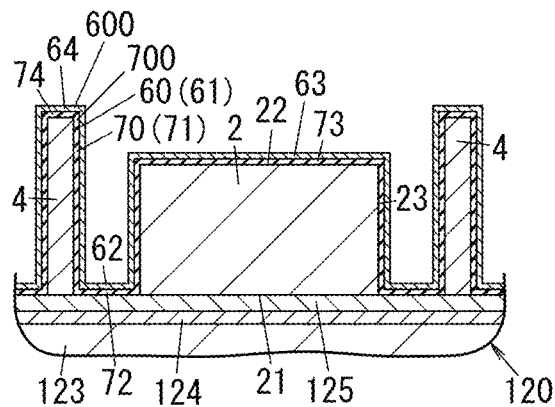

With the above-described other manufacturing method, after the pillar forming process, the structure shown in FIG. 9C is obtained by performing the intermediate layer forming process of forming the intermediate layers 70 each covering the side surface of the conductor pillar 4, and the structure shown in FIG. 9D is obtained by performing the conductor layer forming process of forming the conductor layers 60 each covering the side surface of the intermediate layer 70. Here, the pillar forming process is a process between the component disposing process and the intermediate layer forming process. In the intermediate layer forming process, as well as the above-described fourth process, the electrically insulating layer 700 that defines the electrically insulating portion 7 (see FIG. 1A) is formed. More specifically, in the intermediate layer forming process, the electrically insulating layer 700 covering the exposed portion of the surface 121 of the support 120, the side surface and distal end surface of each conductor pillar 4, and the side surface 23 and back surface 22 of the chip electronic component 2 is formed. The electrically insulating layer 700 includes fourth intermediate layers 74 each covering the distal end surface of the conductor pillar 4, in addition to the intermediate layers 70 (first intermediate layers 71), the second intermediate layer 72, and the third intermediate layer 73. In the conductor layer forming process, as well as the fifth process, the metal layer 600 is formed on the electrically insulating layer 700. The metal layer 600 includes fourth conductor layers 64 in addition to the conductor layers 60 (first conductor layers 61), the second conductor layer 62, and the third conductor layer 63. In the above-described other manufacturing method, processes after the electrically conductive layer forming process are the same or substantially the same as those of the manufacturing method for the electronic component 1 according to the first preferred embodiment.

With the above-described other manufacturing method, as well as the manufacturing method for the electronic component 1 according to the first preferred embodiment, the electronic component 1 including the coaxial structures 14, the chip electronic component 2, and the wiring layers 5 can be even more easily manufactured. In addition, with the above-described other manufacturing method, disposition of the chip electronic component 2 is facilitated as compared to the manufacturing method for the electronic component 1 according to the first preferred embodiment.

Second Preferred Embodiment

Figure 10:
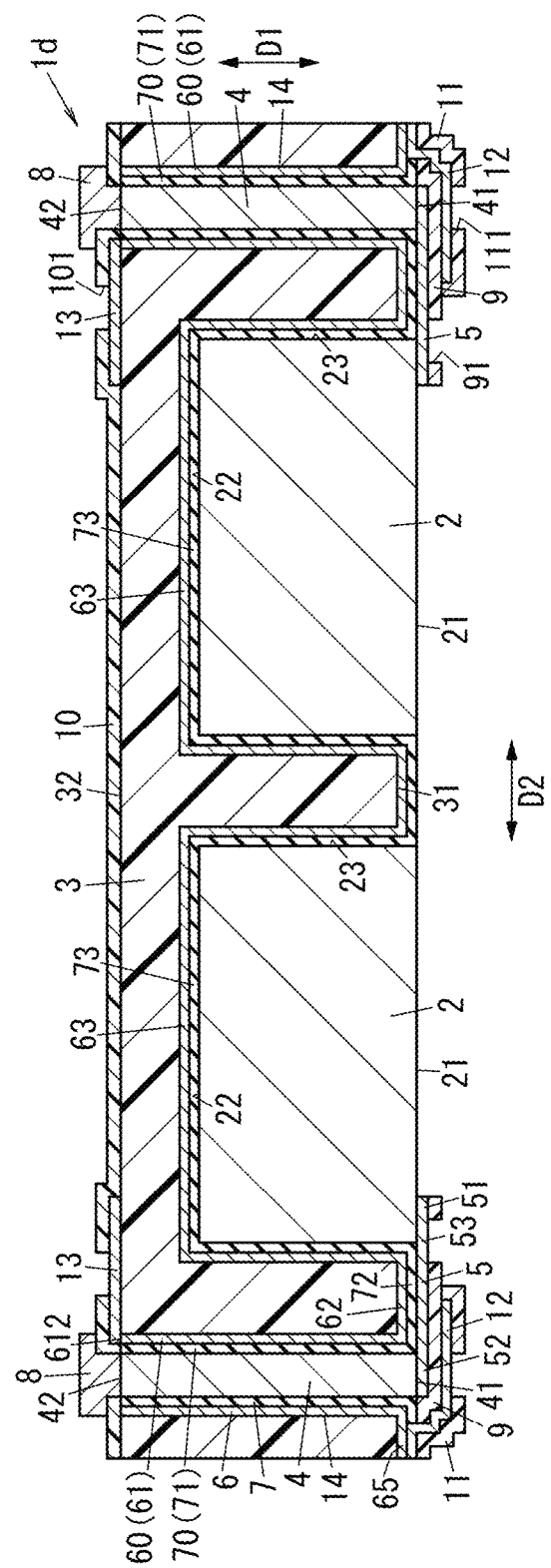
FIG. 10 is a cross-sectional view of an electronic component according to a second preferred embodiment of the present invention.

As shown in FIG. 10, an electronic component 1d according to a second preferred embodiment of the present invention differs from the electronic component 1 (see FIG. 1A) according to the first preferred embodiment in that a plurality of (two in the illustrated example) the chip electronic components 2 are provided. As for the electronic component 1d according to the second preferred embodiment, the reference numerals denote the same or similar elements to those of the electronic component 1 of the first preferred embodiment, and the description thereof is omitted.

A manufacturing method for the electronic component 1d according to the second preferred embodiment is the same as or similar to the manufacturing method for the electronic component 1 according to the first preferred embodiment, and differs in that a plurality of the chip electronic components 2 are disposed in the component disposing process.

With the electronic component 1d according to the second preferred embodiment, the side surface 23 of each chip electronic component 2 is covered with the third conductor layer 63 via the third intermediate layer 73, such that interference due to electromagnetic waves between the adjacent two chip electronic components 2 can be reduced or prevented. Thus, with the electronic component 1d according to the second preferred embodiment, a distance between the adjacent two chip electronic components 2 can be further reduced, such that miniaturization of the configuration including a plurality of the chip electronic components 2 is possible.

The plurality of chip electronic components 2 may be chip electronic components of the same or similar type or may be chip electronic components of different types. The number of the chip electronic components 2 is not limited to two and may be three or more. When the number of the chip electronic components 2 is three or more, only a portion of the chip electronic components 2 may be chip electronic components of the same type. When the electronic component 1 includes the plurality of chip electronic components 2, the layout of the conductor pillars 4 and the wiring layers 5 may be varied among the chip electronic components 2.

Third Preferred Embodiment

Figure 11:
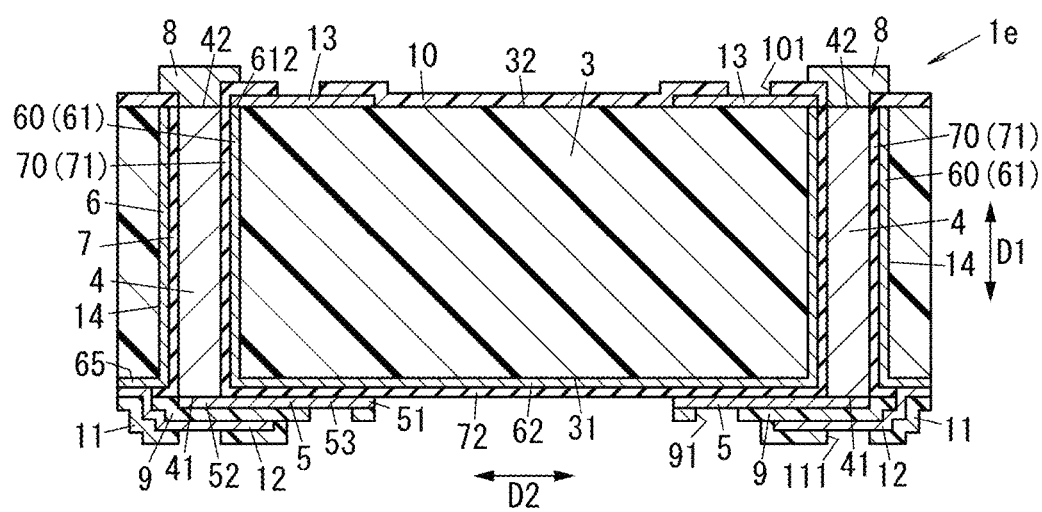
FIG. 11 is a cross-sectional view of an electronic component according to a third preferred embodiment of the present invention.

As shown in FIG. 11, an electronic component 1e according to a third preferred embodiment of the present invention differs from the electronic component 1 according to the first preferred embodiment in that the chip electronic component 2 in the electronic component 1 (see FIG. 1A) according to the first preferred embodiment is not provided. As for the electronic component 1e according to the third preferred embodiment, the same reference numerals denote the same or similar elements to those of the electronic component 1 of the first preferred embodiment, and the description thereof is omitted.

A manufacturing method for the electronic component 1e according to the third preferred embodiment is the same as or similar to the manufacturing method for the electronic component 1 according to the first preferred embodiment, and differs in that the component disposing process is not provided.

In the electronic component 1e, of the chip electronic component 2 and the conductor pillars 4 in the electronic component (see FIG. 1A) according to the first preferred embodiment, the wiring layers 5 are connected to only the conductor pillars 4. The electronic component 1e can be used as, for example, a circuit board having the coaxial structures 14.

In the electronic component 1e, each intermediate layer 70 between the conductor pillar 4 and the conductor layer 60 is the electrically insulating layer. However, the intermediate layer 70 is not limited thereto. In the electronic component 1e, the intermediate layer 70 may be an air layer. When the intermediate layer 70 is an air layer, a sacrificial layer interposed between the conductor pillar 4 and the conductor layer 60 is removed by etching in manufacturing the electronic component 1e. In the manufacturing method for the electronic component 1e, the sacrificial layer in this case is the intermediate layer 70 defined by the electrically insulating layer that is formed in the intermediate layer forming process. The sacrificial layer is not limited to the case where the sacrificial layer is made of a material having an electrically insulating property, and may be made of a material having an electrical conductivity.

Fourth Preferred Embodiment

Figure 12:
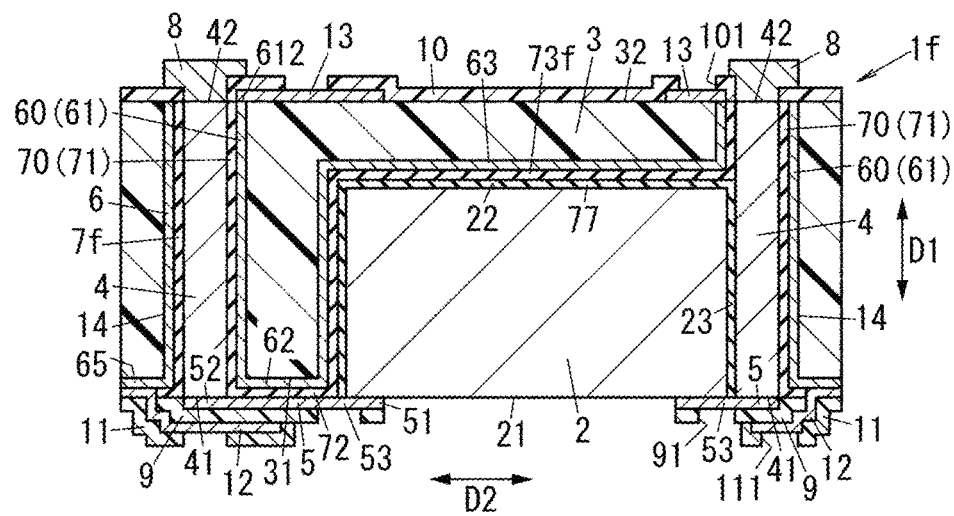
FIG. 12 is a cross-sectional view of an electronic component according to a fourth preferred embodiment of the present invention.

As shown in FIG. 12, an electronic component 1*f* according to a fourth preferred embodiment of the present invention differs from the electronic component 1 (see FIG. 1A) according to the first preferred embodiment in that, in addition to the intermediate layers 70 (first intermediate layers 71), the second intermediate layer 72, and a third intermediate layer 73*f*, an electrically insulating layer 77 that covers both the side surface 23 and back surface 22 of the chip electronic component 2 is provided. In addition, the electronic component 1*f* according to the fourth preferred embodiment differs from the electronic component 1 according to the first preferred embodiment in that the third intermediate layer 73*f* is provided instead of the third intermediate layer 73 of the electronic component 1 according to the first preferred embodiment. As for the electronic component 1*f* according to the fourth preferred embodiment, the same reference numerals denote the same or similar elements to those of the electronic component 1 of the first preferred embodiment, and the description thereof is omitted.

The electrically insulating layer 77 has an electrically insulating property. In the electronic component 1*f*, the dielectric constant and dielectric loss tangent of the electrically insulating layer 77 are respectively less than the dielectric constant and dielectric loss tangent of the resin molding 3. Also, in the electronic component 1*f*, the dielectric constant and dielectric loss tangent of the electrically insulating layer 77 are respectively less than the dielectric constant and dielectric loss tangent of a base material (in the case of an SAW filter, for example, a piezoelectric substrate) supporting the functional portion in the chip electronic component 2. The electrically insulating layer 77 is defined by an inorganic electrically insulating layer. The inorganic electrically insulating layer is made of an inorganic electrically insulating material. The inorganic electrically insulating material that is used for the electrically insulating layer is preferably, for example, silicon oxide. The electrically insulating layer 77 is not limited to an inorganic electrically insulating layer and may be an organic electrically insulating layer. The material of the organic electrically insulating layer is preferably, for example, a fluorine-based resin, bismaleimide, or the like. The material of the electrically insulating layer 77 may be the same as the material of the intermediate layers 70.

In the electronic component 1*f* according to the fourth preferred embodiment, at least a portion of the side surface of at least one of the plurality of pillars 4 is adjoined to the electrically insulating layer 77.

In the electronic component 1*f* according to the fourth preferred embodiment, the third intermediate layer (third electrically insulating portion) 73*f* is in contact with the electrically insulating layer 77. Here, the third intermediate layer 73*f* covers the back surface 22 and side surface 23 of the chip electronic component 2 via the electrically insulating layer 77. In the electronic component 1*f* according to the fourth preferred embodiment, the plurality of first intermediate layers 71, the second intermediate layer 72, and the third intermediate layer 73*f* are integrally provided.

Hereinafter, a non-limiting example of a manufacturing method for the electronic component 1*f* according to the fourth preferred embodiment will be described with reference to FIGS. 13A to 13F, and FIGS. 14A to 14F. As for the manufacturing method for the electronic component 1*f* according to the fourth preferred embodiment, the description of the same or similar processes to those of the manufacturing method for the electronic component 1 according to the first preferred embodiment is omitted where appropriate.

In the manufacturing method for the electronic component 1*f* according to the fourth preferred embodiment, after the chip electronic component 2 and the support 120 are prepared, the first process to the eleventh process are performed sequentially.

Figure 13A:
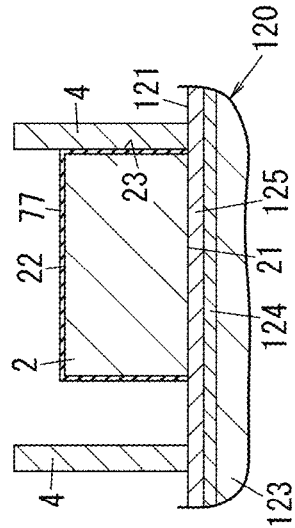
FIGS. 13A to 13F are process cross-sectional views for illustrating a manufacturing method for the electronic component according to the fourth preferred embodiment of the present invention.
Figure 13B:
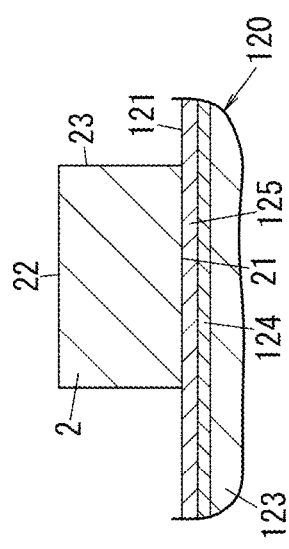
Figure 13C:
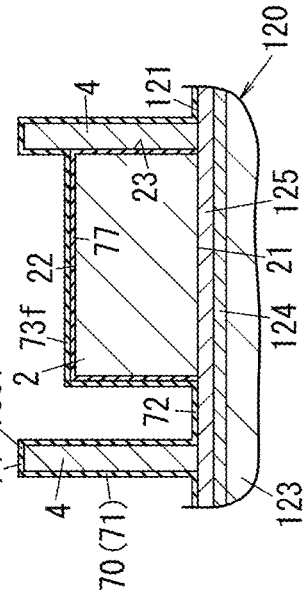
Figure 13D:
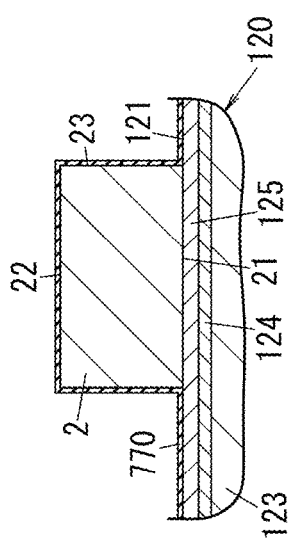

The first process is the component disposing process. In the component disposing process, as shown in FIG. 13A, the chip electronic component 2 is temporarily fixed on the electrically conductive layer 125 of the support 120.

The second process is the electrically insulating layer forming process of forming an electrically insulating film 770 (see FIG. 13B) that defines the electrically insulating layer 77. The material of the electrically insulating film 770 is preferably, for example, silicon oxide. In the second process, the electrically insulating film 770 is formed by, for example, CVD. In the second process, not limited to CVD, the electrically insulating film 770 may be formed by, for example, sputtering, spray coating, or the like.

In the third process, the electrically insulating layer (see FIG. 13C) is formed by patterning the electrically insulating film 770 using, for example, a lithography technique and an etching technique. In the manufacturing method for the electronic component 1*f* according to the fourth preferred embodiment, the second process and the third process make up the electrically insulating layer forming process of forming the electrically insulating layer 77 covering both the side surface 23 and back surface 22 of the chip electronic component 2.

In the fourth process, the pillar forming process of forming the pillars 4 having electrical conductivity on the surface 121 of the support 120 is performed. In the pillar forming process, the plurality of conductor pillars 4 are formed on the electrically conductive layer 125 of the support 120. In this process, first, a positive photoresist layer that covers the exposed region of the electrically conductive layer 125 of the support 120 and the chip electronic component 2 is formed. After that, portions of the electrically conductive layer 125, which will be beds for the conductor pillars 4, are exposed by removing portions at positions where the conductor pillars 4 will be formed in the photoresist layer by using a photolithography technique (forming hole portions at positions where the conductor pillars 4 will be formed). After that, the conductor pillars 4 are formed by electrolytic plating. In forming the conductor pillars 4, the conductor pillars 4 are deposited from the exposed surfaces of the electrically conductive layer 125 along the thickness direction of the photoresist layer by passing current between an anode opposed to the surface of the photoresist layer via a plating solution including copper sulfate and a cathode defined by the electrically conductive layer 125. After that, the photoresist layer is removed.

Figure 13E:
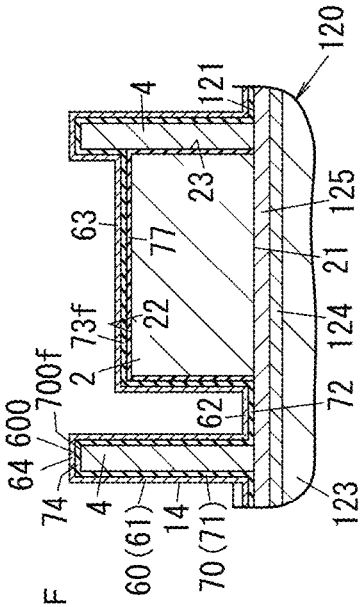

In the fifth process, as shown in FIG. 13E, an electrically insulating layer 700*f* that defines the electrically insulating portion 7*f* (see FIG. 12) is formed. More specifically, in the fifth process, the electrically insulating layer 700*f* that covers the exposed portion of the surface 121 of the support 120, the side surface and distal end surface of each conductor pillar 4, and the electrically insulating layer 77 is formed. The electrically insulating layer 700*f* includes the fourth intermediate layers 74 each covering the distal end surface of the conductor pillar 4, in addition to the intermediate layers 70 (first intermediate layers 71), the second intermediate layer 72, and the third intermediate layer 73f. The material of the electrically insulating layer 700f is preferably, for example, silicon oxide. In the fifth process, the electrically insulating layer 700f is formed by, for example, CVD. Thus, in the fifth process, the first intermediate layers 71, the second intermediate layer 72, the third intermediate layer 73f, and (the fourth intermediate layers 74) can be integrally formed. In the fifth process, not limited to CVD, the electrically insulating layer 700f may be formed by, for example, sputtering, spray coating, or the like. In the manufacturing method for the electronic component 1f according to the fourth preferred embodiment, the fifth process is the intermediate layer forming process of forming the intermediate layers 70 each covering the side surface of the conductor pillar 4.

Figure 13F:
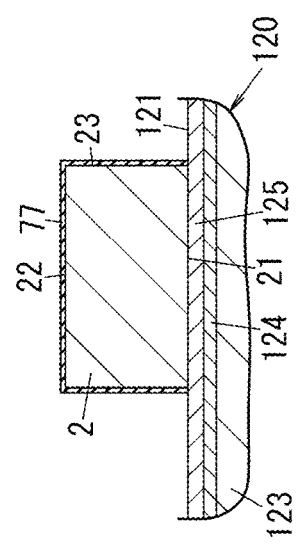

In the sixth process, as shown in FIG. 13F, the metal layer 600 that defines the shield portion 6 (see FIG. 12) is formed. More specifically, in the sixth process, the metal layer 600 is formed on the electrically insulating layer 700f. The metal layer 600 includes fourth conductor layers 64 in addition to the conductor layers 60 (first conductor layers 61), the second conductor layer 62, and the third conductor layer 63. In the sixth process, the metal layer 600 is formed by, for example, CVD. Thus, in the sixth process, the first conductor layers 61, the second conductor layer 62, the third conductor layer 63, and (the fourth conductor layers 64) can be integrally formed. In the sixth process, not limited to CVD, the metal layer 600 may be formed by, for example, sputtering (for example, oblique sputtering), evaporation (for example, oblique evaporation), spray coating, electroless plating, or the like. In the manufacturing method for the electronic component 1f according to the fourth preferred embodiment, the sixth process is the conductor layer forming process of forming the conductor layers 60 each covering the side surface of the intermediate layer 70.

Figure 14D:
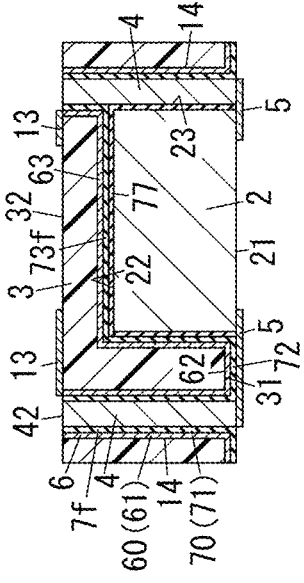
FIGS. 14A to 14F are process cross-sectional views for illustrating a manufacturing method for the electronic component according to the fourth preferred embodiment of the present invention.
Figure 14E:
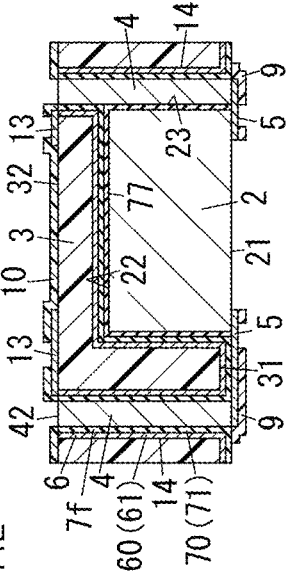
Figure 14F:
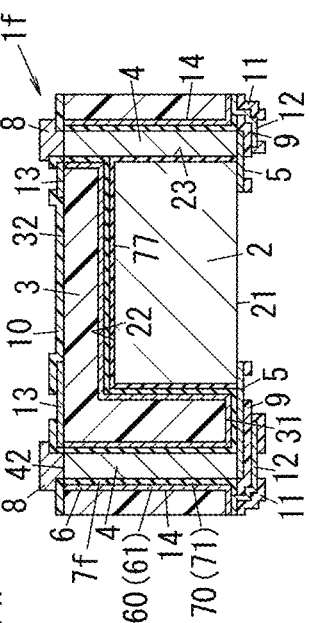
Figure 14A:
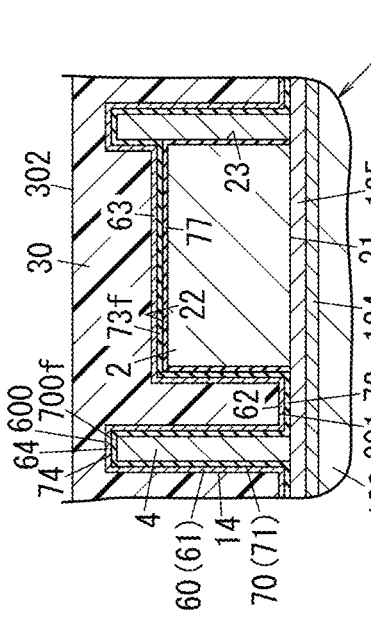

In the seventh process, as shown in FIG. 14A, the resin structure 30 that defines the resin molding 3 (see FIG. 14B) is formed on the support 120. Here, in the seventh process, the resin structure 30 is formed on the support 120 so as to cover the metal layer 600 covering the electrically insulating layer 700f. In short, in the seventh process, the resin structure 30 is formed on the electrically conductive layer 125 of the support 120 via the electrically insulating layer 700f and the metal layer 600. Here, the resin structure 30 includes a first surface 301 and a second surface 302 that are on opposite sides in the thickness direction. The first surface 301 of the resin structure 30 is a surface that contacts the second conductor layer 62 of the metal layer 600. The resin structure 30 covers the back surface 22 and side surface 23 of the chip electronic component 2 via the metal layer 600, the electrically insulating layer 700f, and the electrically insulating layer 77. Furthermore, the resin structure 30 covers the side surfaces and distal end surfaces of the conductor pillars 4 via the metal layer 600 and the electrically insulating layer 700f. Therefore, the resin structure 30 is thicker than the resin molding 3, and a portion of the resin structure 30, a portion of the metal layer 600, and a portion of the electrically insulating layer 700f are interposed between the second surface 302 of the resin structure 30 and the distal end surfaces of the conductor pillars 4. In the manufacturing method for the electronic component 1f according to the fourth preferred embodiment, the seventh process is the resin molding process of molding the resin structure 30 covering the side surfaces of the conductor layers 60.

Figure 14B:
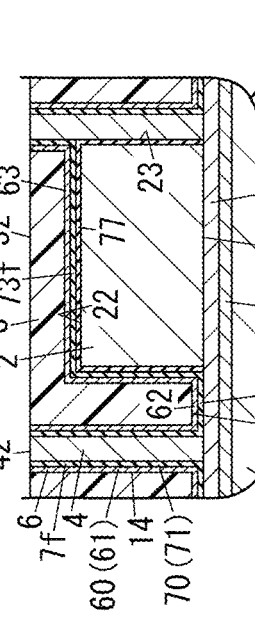

In the eighth process, as shown in FIG. 14B, the resin molding 3 is formed by grinding the resin structure 30 from the second surface 302 side opposite from the first surface 301 until the thickness of the resin molding 3 is obtained. Through the eighth process, a structure including the resin molding 3, the conductor pillars 4, the electrically insulating portion 7f, and the shield portion 6 is formed. In the manufacturing method for the electronic component 1f according to the fourth preferred embodiment, the eighth process is the grinding process.

Figure 14C:
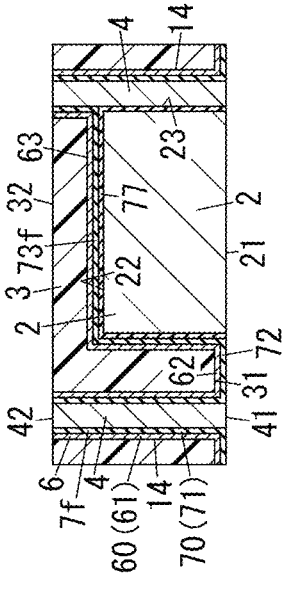

In the ninth process, as shown in FIG. 14C, the support 120 and the resin adhesion layer are removed from the structure including the chip electronic component 2, the resin molding 3, the conductor pillars 4, the electrically insulating portion 7f, the shield portion 6, the support 120, and the resin adhesion layer (not shown). Thus, in the ninth process, the front surface 21 of the chip electronic component 2, both end surfaces (the first end surface 41 and the second end surface 42) of each conductor pillar 4, a portion of the electrically insulating portion 7f, and a portion of the shield portion 6 are exposed. In the manufacturing method for the electronic component 1f according to the fourth preferred embodiment, the ninth process is the removing process of removing the support 120.

In the tenth process, as shown in FIG. 14D, the plurality of wiring layers 5 each electrically connecting the chip electronic component 2 to the associated conductor pillar 4 are formed. In the manufacturing method for the electronic component 1f according to the fourth preferred embodiment, the tenth process is the wiring layer forming process. In the wiring layer forming process, the wiring layers 5 each electrically connecting the chip electronic component 2 to the associated conductor pillar 4 are formed.

Also, in the tenth process, as shown in FIG. 14D, the plurality of second grounding wiring layers 13 are formed.

In the eleventh process, as shown in FIG. 14E, the first resist layers 9 and the second resist layer 10 are formed.

In the twelfth process, as shown in FIG. 14F, each of the plurality of electrodes 8 that are in a one-to-one correspondence with the plurality of conductor pillars 4 is formed on the second end surface 42 of an associated one of the plurality of conductor pillars 4.

Also, in the twelfth process, as shown in FIG. 14F, the first grounding wiring layers 12 are formed, and then the third resist layers 11 are formed.

The manufacturing method for the electronic component 1f according to the fourth preferred embodiment, as well as the manufacturing method for the electronic component 1 according to the first preferred embodiment, includes the pillar forming process of forming the conductor pillars 4 on the surface 121 of the support 120, the intermediate layer forming process of forming the intermediate layers 70 each covering the side surface of an associated one of the conductor pillars 4, the conductor layer forming process of forming the conductor layers 60 each covering the side surface of an associated one of the intermediate layers 70, and the resin molding process of molding the resin structure 30 covering the side surfaces of the conductor layers 60. Thus, with the manufacturing method for the electronic component 1f according to the fourth preferred embodiment, as well as the manufacturing method for the electronic component 1 according to the first preferred embodiment, the electronic component 1f having the coaxial structures 14 each including the conductor pillar 4 and the conductor layer 60 can be more easily manufactured.

The above-described first to fourth preferred embodiments are each one of various preferred embodiments of the present invention. The first to fourth preferred embodiments each may be modified in various ways according to design, or the like, as long as the advantageous effects of the present invention are achieved.

It is apparent from the above-described preferred embodiments of the present invention that the following features are disclosed.

A manufacturing method for an electronic component (1; 1a; 1b; 1c; 1d; 1e; 1f) according to a preferred embodiment of the present invention includes a pillar forming process of forming an electrically conductive pillar (4) on a surface (121) of a support (120), an intermediate layer forming process of forming an intermediate layer (70) covering a side surface of the pillar (4), a conductor layer forming process of forming a conductor layer (60) covering a side surface of the intermediate layer (70), and a resin molding process of molding a resin structure (30) covering a side surface of the conductor layer (60).

With a manufacturing method for an electronic component (1; 1a; 1b; 1c; 1d; 1e; 1f) according to a preferred embodiment of the present invention, the electronic component (1; 1a; 1b; 1c; 1d; 1e; 1f) having a coaxial structure (14) including the pillar (4) and the conductor layer (60) can be more easily manufactured.

A manufacturing method for an electronic component (1; 1a; 1b; 1c; 1d; 1e; 1f) according to a preferred embodiment of the present invention further includes a removing process of removing the support (120) after the resin molding process.

With a manufacturing method for an electronic component (1; 1a; 1b; 1c; 1d; 1e; 1f) according to a preferred embodiment of the present invention, the end surface of the coaxial structure (14) on the support (120) side can be exposed.

A manufacturing method for an electronic component (1; 1a; 1b; 1c; 1d) according to a preferred embodiment of the present invention further includes a component disposing process between the pillar forming process and the intermediate layer forming process, and a wiring layer forming process after the removing process. In the component disposing process, a chip electronic component (2) is disposed on the surface (121) of the support (120) at a position spaced away from the side surface of the pillar (4). In the wiring layer forming process, a wiring layer (5) electrically connecting the chip electronic component (2) and the pillar (4) is formed.

With a manufacturing method for an electronic component (1; 1a; 1b; 1c; 1d) according to a preferred embodiment of the present invention, the electronic component (1; 1a; 1b; 1c; 1d) including the coaxial structure (14), the chip electronic component (2), and the wiring layer (5) can be even more easily manufactured.

A manufacturing method for an electronic component (1; 1a; 1b; 1c; 1d) according to a preferred embodiment of the present invention further includes a component disposing process of disposing a chip electronic component (2) on the surface (121) of the support (120), and a wiring layer forming process after the removing process. The pillar forming process is a process between the component disposing process and the intermediate layer forming process. In the pillar forming process, the pillar (4) is disposed on the surface (121) of the support (120) at a position spaced away from the side surface (23) of the chip electronic component (2). In the wiring layer forming process, a wiring layer (5) electrically connecting the chip electronic component (2) and the pillar (4) is formed.

With a manufacturing method for an electronic component (1; 1a; 1b; 1c; 1d) according to a preferred embodiment of the present invention, the electronic component (1; 1a; 1b; 1c; 1d) including the coaxial structure (14), the chip electronic component (2), and the wiring layer (5) can be even more easily manufactured.

A manufacturing method for an electronic component (1f) according to a preferred embodiment of the present invention further includes a component disposing process of disposing a chip electronic component (2) on the surface (121) of the support (120) such that a front surface (21) of the chip electronic component (2) faces the surface (121) of the support (120), an electrically insulating layer forming process of forming an electrically insulating layer (77) covering both a side surface (23) and a back surface (22) of the chip electronic component (2) between the component disposing process and the pillar forming process, and a wiring layer forming process after the removing process. The pillar forming process is a process of forming a plurality of the pillars (4) between the electrically insulating layer forming process and the intermediate layer forming process. In the pillar forming process, the plurality of pillars (4) is formed on the surface (121) of the support (120) such that at least a portion of a side surface of at least one of the plurality of pillars (4) is adjoining to the electrically insulating layer (77).

With the manufacturing method for an electronic component (1f) according to the fifth aspect, the electronic component (1f) including the coaxial structure (14), the chip electronic component (2), and the wiring layer (5) can be more easily manufactured.

In a manufacturing method for an electronic component (1; 1a; 1b; 1c; 1d) according to a preferred embodiment of the present invention, in the component disposing process, the chip electronic component (2) is disposed on the surface (121) of the support (120) such that a front surface (21) of the chip electronic component (2) faces the surface (121) of the support (120). In the intermediate layer forming process, a first intermediate layer (71) that is the intermediate layer (70), a second intermediate layer (72) covering an exposed region of the surface (121) of the support (120), and a third intermediate layer (73) covering both a back surface (22) and an exposed region of a side surface (23) of the chip electronic component (2) are integrally formed.

With a manufacturing method for an electronic component (1; 1a; 1b; 1c; 1d) according to a preferred embodiment of the present invention, no interface is formed between the first intermediate layer (71) and the second intermediate layer (72) or between the second intermediate layer (72) and the third intermediate layer (73), so the electronic component (1; 1a; 1b; 1c; 1d) having a highly reliable electrically insulating property can be manufactured.

In a manufacturing method for an electronic component (1f) according to a preferred embodiment of the present invention, in the intermediate layer forming process, a first intermediate layer (71) that is the intermediate layer (70), a second intermediate layer (72) covering an exposed region of the surface (121) of the support (120), and a third intermediate layer (73f) covering an exposed region of the electrically insulating layer (77) are integrally formed.

With a manufacturing method for an electronic component (1f) according to a preferred embodiment of the present invention, no interface is formed between the first intermediate layer (71) and the second intermediate layer (72) or between the second intermediate layer (72) and the third intermediate layer (73f), so the electronic component (1f) having a highly reliable electrically insulating property can be manufactured.

In a manufacturing method for an electronic component (1; 1a; 1b; 1c; 1d; 1f) according to a preferred embodiment of the present invention, in the conductor layer forming process, a first conductor layer (61) that is the conductor layer (60), a second conductor layer (62) covering the second intermediate layer (72), and a third conductor layer (63) covering the third intermediate layer (73; 73f) are integrally formed.

With a manufacturing method for an electronic component (1; 1a; 1b; 1c; 1d; 1f) according to a preferred embodiment of the present invention, no interface is formed between the first conductor layer (61) and the second conductor layer (62) or between the second conductor layer (62) and the third conductor layer (63), so the electronic component (1; 1a; 1b; 1c; 1d; 1f) having highly reliable electromagnetic shielding performance can be manufactured.

In a manufacturing method for an electronic component (1; 1a; 1b; 1c; 1d; 1f) according to a preferred embodiment of the present invention, in the resin molding process, a resin structure (30) is molded so as to cover the first conductor layer (61), the second conductor layer (62), and the third conductor layer (63) on the surface (121) side of the support (120). The manufacturing method for an electronic component (1; 1a; 1b; 1c; 1d; 1f) further includes a grinding process of grinding the resin structure (30) such that a distal end surface of the pillar (4) is exposed.

With a manufacturing method for an electronic component (1; 1a; 1b; 1c; 1d; 1f) according to a preferred embodiment of the present invention, the coaxial structure (14) including the pillar (4) can be exposed by grinding the resin structure (30).

In a manufacturing method for an electronic component (1; 1a; 1b; 1c; 1d; 1e; 1f) according to a preferred embodiment of the present invention, the intermediate layer (70) is an electrically insulating layer.

With a manufacturing method for an electronic component (1; 1a; 1b; 1c; 1d; 1e; 1f) according to a preferred embodiment of the present invention, the electrically insulating layer can be interposed between the pillar (4) and the conductor layer (60) as the intermediate layer (70), such that manufacturing of the intermediate layer (70) is facilitated as compared to the case where the intermediate layer (70) is an air layer.

In a manufacturing method for an electronic component (1; 1a; 1b; 1c; 1d; 1e; 1f) according to a preferred embodiment of the present invention, in the conductor layer forming process, the conductor layer (60) is formed by CVD or sputtering.

With a manufacturing method for an electronic component (1; 1a; 1b; 1c; 1d; 1e; 1f) according to a preferred embodiment of the present invention, uniformity in the thickness of the conductor layer (60) can be improved.

In a manufacturing method for an electronic component (1; 1a; 1b; 1c; 1d; 1e; 1f) according to a preferred embodiment of the present invention, in the intermediate layer forming process, the intermediate layer (70) is formed by CVD, sputtering, or spray coating.

With a manufacturing method for an electronic component (1; 1a; 1b; 1c; 1d; 1e; 1f) according to a preferred embodiment of the present invention, uniformity in the thickness of the intermediate layer (70) can be improved.

In a manufacturing method for an electronic component (1; 1a; 1b; 1c; 1d; 1e; 1f) according to a preferred embodiment of the present invention, the support (120) includes an electrically conductive layer (125). In the pillar forming process, the pillar (4) is formed on the electrically conductive layer (125).

With a manufacturing method for an electronic component (1; 1a; 1b; 1c; 1d; 1e; 1f) according to a preferred embodiment of the present invention, the pillar (4) can be easily formed.

An electronic component (1; 1a; 1b; 1c; 1d; 1e; 1f) according to a preferred embodiment of the present invention includes a pillar (4), a conductor layer (60), an intermediate layer (70), and a resin molding (3). The conductor layer (60) surrounds a side surface of the pillar (4). The conductor layer (60) is spaced away from the side surface of the pillar (4). The intermediate layer (70) is defined by an electrically insulating layer. The intermediate layer (70) is interposed between the pillar (4) and the conductor layer (60). The resin molding (3) covers a side surface of the conductor layer (60). The resin molding (3) is a molding molded from a resin material by a molding method, such as press molding and transfer molding, different from a manufacturing method for a printed circuit board.

An electronic component (1; 1a; 1b; 1c; 1d; 1e; 1f) according to a preferred embodiment of the present invention can be more easily manufactured as compared to an electronic component having an existing coaxial structure. In addition, an electronic component (1; 1a; 1b; 1c; 1d; 1e; 1f) according to a preferred embodiment of the present invention is able to improve the accuracy of coaxiality between the pillar (4) and the conductor layer (60). Since the electronic component (1; 1a; 1b; 1c; 1d; 1e; 1f) has the coaxial structure (14) including the pillar (4) and the conductor layer (60), the electronic component (1; 1a; 1b; 1c; 1d; 1e; 1f) has an advantage that the pillar (4) is insusceptible to electromagnetic waves from the outside and an advantage that propagation losses of radio-frequency signals passing through the pillar (4) can be reduced or prevented. In other words, the electronic component (1; 1a; 1b; 1c; 1d; 1e; 1f) is able to reduce or prevent characteristic degradation due to the influence of electromagnetic waves from the outside.

An electronic component (1; 1a; 1b; 1c; 1d; 1f) according to a preferred embodiment of the present invention further includes a chip electronic component (2) spaced away from a side surface of the conductor layer (60). The resin molding (3) covers the side surface of the conductor layer (60), and a back surface (22) and at least a portion of a side surface (23) of the chip electronic component (2).

With an electronic component (1; 1a; 1b; 1c; 1d; 1f) according to a preferred embodiment of the present invention, even for, for example, a component that generates electromagnetic waves while the chip electronic component (2) is in operation, radio-frequency signals that pass through the pillar (4) are insusceptible to electromagnetic waves from the chip electronic component (2).

An electronic component (1; 1a; 1b; 1c; 1d; 1f) according to a preferred embodiment of the present invention further includes a wiring layer (5) electrically connecting the chip electronic component (2) and the pillar (4).

With an electronic component (1; 1a; 1b; 1c; 1d; 1f) according to a preferred embodiment of the present invention, radio-frequency signals that pass through the wiring layer (5) and the pillar (4), connected to the chip electronic component (2), are insusceptible to electromagnetic waves from the chip electronic component (2). Thus, with the electronic component (1; 1a; 1b; 1c; 1d; 1f), the wiring length of the wiring layer (5) can be further reduced, such that miniaturization of the electronic component (1; 1a; 1b; 1c; 1d; 1f) can be achieved.

An electronic component (1; 1a; 1b; 1c; 1d; 1f) according to a preferred embodiment of the present invention includes an electrically insulating portion (7; 7f) and a shield portion (6). The electrically insulating portion (7; 7f) includes a first intermediate layer (71) defined by the intermediate layer, a second intermediate layer (72), and a third intermediate layer (73; 73f). The electrically insulating portion (7; 7f) has an electrically insulating property. The shield portion (6) includes a first conductor layer (61) defined by the conductor layer (60), a second conductor layer (62), and a third conductor layer (63). The second intermediate layer (72) is located between the wiring layer (5) and the resin molding (3). The third intermediate layer (73; 73f) covers the back surface (22) and side surface (23) of the chip electronic component (2). The second conductor layer (62) is interposed between the resin molding (3) and the second intermediate layer (72). The third conductor layer (63) is interposed between the resin molding (3) and the third intermediate layer (73; 73f). A dielectric constant and dielectric loss tangent of the electrically insulating portion (7; 7f) are respectively less than a dielectric constant and dielectric loss tangent of the resin molding (3).

With an electronic component (1; 1a; 1b; 1c; 1d; 1f) according to a preferred embodiment of the present invention, a parasitic capacitance that occurs between the wiring layer (5) and the shield portion (6) is reduced or prevented.

In an electronic component (1; 1a; 1b; 1c; 1d; 1f) according to a preferred embodiment of the present invention, the dielectric constant and dielectric loss tangent of the electrically insulating portion (7; 7f) are respectively less than a dielectric constant and dielectric loss tangent of a base material supporting a functional portion in the chip electronic component (2).

With an electronic component (1; 1a; 1b; 1c; 1d; 1f) according to a preferred embodiment of the present invention, a parasitic capacitance that occurs between the shield portion (6) and the functional portion of the chip electronic component (2) is reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A manufacturing method for an electronic component, comprising:
   forming an electrically conductive pillar on a surface of a support;
   forming an intermediate layer covering a side surface of the pillar;
   forming a conductor layer covering a side surface of the intermediate layer;
   molding a resin structure covering a side surface of the conductor layer; and
   removing the support after molding the resin structure.

2. The manufacturing method for an electronic component according to claim 1, further comprising:
   providing a component between the forming the pillar and the forming the intermediate layer; and
   forming a wiring layer after the removing the support; wherein
   in the providing the component, a chip electronic component is disposed on the surface of the support at a position spaced away from the side surface of the pillar; and
   in the forming the wiring layer, a wiring layer electrically connecting the chip electronic component and the pillar is formed.

3. The manufacturing method for an electronic component according to claim 1, further comprising:
   disposing a chip electronic component on the surface of the support; and
   forming a wiring layer after the removing the support; wherein
   the forming the pillar is performed between the disposing the chip electronic component and the forming the intermediate layer;
   in the forming the pillar, the pillar is disposed on the surface of the support at a position spaced away from the side surface of the chip electronic component; and
   in the forming the wiring layer, a wiring layer electrically connecting the chip electronic component and the pillar is formed.

4. The manufacturing method for an electronic component according to claim 1, further comprising:
   disposing a chip electronic component on the surface of the support such that a surface of the chip electronic component faces the surface of the support;
   forming an electrically insulating layer covering both a side surface and back surface of the chip electronic component between the disposing the chip electronic component and the forming the pillar; and
   forming a wiring layer after the removing the support; wherein
   the forming the pillar includes forming a plurality of the pillars between the forming the electrically insulating layer and the forming the intermediate layer; and
   in the forming the pillar, the plurality of pillars are formed on the surface of the support such that at least a portion of a side surface of at least one of the plurality of pillars is adjoined to the electrically insulating layer.

5. The manufacturing method for an electronic component according to claim 2, wherein
   in the providing the component, a chip electronic component is disposed on the surface of the support such that a surface of the chip electronic component faces the surface of the support; and
   in the forming the intermediate layer, a first intermediate layer defined by the intermediate layer, a second intermediate layer covering an exposed region of the surface of the support, and a third intermediate layer covering both a back surface and an exposed region of a side surface of the chip electronic component are integrally formed.

6. The manufacturing method for an electronic component according to claim 4, wherein, in the forming the intermediate layer, a first intermediate layer defined by the intermediate layer, a second intermediate layer covering an exposed region of the surface of the support, and a third intermediate layer covering an exposed region of the electrically insulating layer are integrally formed.

7. The manufacturing method for an electronic component according to claim 5, wherein, in the forming the conductor layer, a first conductor layer defined by the conductor layer, a second conductor layer covering the second intermediate layer, and a third conductor layer covering the third intermediate layer are integrally formed.

8. The manufacturing method for an electronic component according to claim 7, wherein
in the molding the resin structure, the resin structure is molded such that the first conductor layer, the second conductor layer, and the third conductor layer are covered on a side of the surface of the support; and
the manufacturing method further comprises grinding the resin structure such that a distal end surface of the pillar is exposed.

9. The manufacturing method for an electronic component according to claim 1, wherein the intermediate layer is an electrically insulating layer.

10. The manufacturing method for an electronic component according to claim 1, wherein, in the forming the conductor layer, the conductor layer is formed by CVD or sputtering.

11. The manufacturing method for an electronic component according to claim 1, wherein, in the forming the intermediate layer, the intermediate layer is formed by CVD, sputtering, or spray coating.

12. The manufacturing method for an electronic component according to claim 1, wherein
the support includes an electrically conductive layer; and
in the forming the pillar, the pillar is formed on the electrically conductive layer by plating.

13. An electronic component comprising:
an electrically conductive pillar;
a conductor layer surrounding a side surface of the pillar and spaced away from the side surface of the pillar;
an intermediate layer defined by an electrically insulating layer and interposed between the pillar and the conductor layer;
a resin molding covering a side surface of the conductor layer;
a chip electronic component spaced away from the side surface of the conductor layer;
a wiring layer electrically connected to the chip electronic component and the pillar;
an electrically insulating portion having an electrically insulating property and including a first intermediate layer, defined by the intermediate layer, a second intermediate layer, and a third intermediate layer; and
a shield portion including a first conductor layer defined by the conductor layer, a second conductor layer, and a third conductor layer; wherein
the resin molding covers the side surface of the conductor layer and a back surface and at least a portion of a side surface of the chip electronic component;
the second intermediate layer is located between the wiring layer and the resin molding;
the third intermediate layer covers the back surface and the side surface of the chip electronic component;
the second conductor layer is interposed between the resin molding and the second intermediate layer;
the third conductor layer is interposed between the resin molding and the third intermediate layer; and
a dielectric constant and a dielectric loss tangent of the electrically insulating portion are respectively less than a dielectric constant and a dielectric loss tangent of the resin molding.

14. The electronic component according to claim 13, wherein the dielectric constant and the dielectric loss tangent of the electrically insulating portion are respectively less than a dielectric constant and a dielectric loss tangent of a base material supporting a functional portion in the chip electronic component.

15. The electronic component according to claim 13, wherein the chip electronic component is a radio-frequency device having a frequency band of about 5 GHz or higher.

16. The electronic component according to claim 13, wherein the chip electronic component is a SAW filter including a piezoelectric substrate including a front surface and a back surface opposed to each other, and a functional portion provided on the front surface of the piezoelectric substrate.

* * * * *